United States Patent
Yeh et al.

(10) Patent No.: US 9,478,259 B1
(45) Date of Patent: Oct. 25, 2016

(54) 3D VOLTAGE SWITCHING TRANSISTORS FOR 3D VERTICAL GATE MEMORY ARRAY

(71) Applicant: MACRONIX INTERNATIONAL CO., LTD., Hsinchu (TW)

(72) Inventors: Teng-Hao Yeh, Hsinchu (TW); Chih-Wei Hu, Hsinchu (TW); Lee-Yin Lin, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/704,706

(22) Filed: May 5, 2015

(51) Int. Cl.
    G11C 5/02        (2006.01)
    H01L 27/115      (2006.01)
    G11C 16/24       (2006.01)
    (Continued)

(52) U.S. Cl.
    CPC .................. *G11C 5/025* (2013.01); *G11C 5/02* (2013.01); *G11C 5/06* (2013.01); *G11C 5/063* (2013.01); *G11C 16/0483* (2013.01); *G11C 16/06* (2013.01); *G11C 16/10* (2013.01); *G11C 16/14* (2013.01); *G11C 16/24* (2013.01); *G11C 16/26* (2013.01); *H01L 27/1157* (2013.01); *H01L 27/11524* (2013.01); *H01L 27/11526* (2013.01);
    (Continued)

(58) Field of Classification Search
    CPC .......... G11C 5/02; G11C 5/025; G11C 5/06; G11C 5/063; G11C 16/0783; G11C 16/06; G11C 16/10; G11C 16/26
    See application file for complete search history.

(56) References Cited

U.S. PATENT DOCUMENTS

| 5,218,471 A | 6/1993 | Swanson et al. |
| 6,034,882 A | 3/2000 | Johnson et al. |

(Continued)

FOREIGN PATENT DOCUMENTS

| EP | 1936681 A1 | 6/2008 |
| EP | 2048709 A2 | 4/2009 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Vanthu Nguyen
(74) *Attorney, Agent, or Firm* — Haynes Beffel & Wolfeld LLP

(57) ABSTRACT

The area consumed by switching transistors for a 3D NAND memory array can be reduced with 3D voltage switching transistors with reduced aggregate area in comparison with 2D voltage switching transistors such as transistors in the substrate. The integrated circuit comprises a 3D NAND array of memory transistors; a plurality of bit lines, with different ones of the plurality of bit lines electrically coupled to different parts of the 3D NAND array; and a plurality of transistor pairs with a stack of semiconductor layers. Different layers in the stack of semiconductor layers include different transistor pairs of the plurality of transistor pairs. Each of the plurality of transistor pairs includes first and second transistors with first, second, and third source/drain terminals. The first transistor includes the first and the third source/drain terminals, and the second transistor includes the second and the third source/drain terminals. The first source/drain terminal is electrically coupled to an erase voltage line. The second source/drain terminal is electrically coupled to a corresponding one of a plurality of program/read voltage lines. The third source/drain terminal is electrically coupled to a corresponding one of the plurality of bit lines.

17 Claims, 33 Drawing Sheets

(51) Int. Cl.
| | |
|---|---|
| G11C 16/14 | (2006.01) |
| G11C 16/26 | (2006.01) |
| G11C 5/06 | (2006.01) |
| G11C 16/04 | (2006.01) |
| G11C 16/06 | (2006.01) |
| G11C 16/10 | (2006.01) |

(52) U.S. Cl.
CPC ... H01L 27/11556 (2013.01); H01L 27/11573 (2013.01); H01L 27/11582 (2013.01)

(56) References Cited

U.S. PATENT DOCUMENTS

| | | | |
|---|---|---|---|
| 6,323,117 | B1 | 11/2001 | Noguchi |
| 6,906,940 | B1 | 6/2005 | Lue |
| 7,018,783 | B2 | 3/2006 | Iwasaki et al. |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,315,474 | B2 | 1/2008 | Lue |
| 7,420,242 | B2 | 9/2008 | Lung |
| 7,696,559 | B2 | 4/2010 | Arai et al. |
| 7,796,437 | B2 | 9/2010 | Cazzaniga |
| 7,851,849 | B2 | 12/2010 | Kiyotoshi |
| 7,855,457 | B2 | 12/2010 | Mizukami et al. |
| 7,915,667 | B2 * | 3/2011 | Knoefler ............ H01L 21/28273 257/206 |
| 8,008,732 | B2 | 8/2011 | Kiyotoshi et al. |
| 8,188,517 | B2 * | 5/2012 | Choi ................ G11C 16/0483 257/211 |
| 8,331,149 | B2 | 12/2012 | Choi et al. |
| 8,363,476 | B2 | 1/2013 | Lue et al. |
| 8,383,512 | B2 | 2/2013 | Chen et al. |
| 8,467,219 | B2 | 6/2013 | Lue |
| 8,503,213 | B2 | 8/2013 | Chen et al. |
| 8,648,438 | B2 | 2/2014 | Cai et al. |
| 8,736,069 | B2 | 5/2014 | Chiu et al. |
| 8,759,899 | B1 | 6/2014 | Lue et al. |
| 8,829,646 | B2 | 9/2014 | Lung et al. |
| 8,853,818 | B2 | 10/2014 | Lue |
| 8,890,233 | B2 | 11/2014 | Hung et al. |
| 9,024,374 | B2 | 5/2015 | Hung et al. |
| 9,147,468 | B1 | 9/2015 | Lue |
| 2002/0106823 | A1 | 8/2002 | Hwang et al. |
| 2003/0064295 | A1 | 4/2003 | Yasuyuki et al. |
| 2004/0023499 | A1 | 2/2004 | Hellig et al. |
| 2005/0280061 | A1 | 12/2005 | Lee |
| 2007/0045708 | A1 | 3/2007 | Lung |
| 2007/0140001 | A1 | 6/2007 | Motoi et al. |
| 2007/0158736 | A1 | 7/2007 | Arai et al. |
| 2007/0252201 | A1 | 11/2007 | Kito et al. |
| 2008/0073635 | A1 | 3/2008 | Kiyotoshi et al. |
| 2008/0101109 | A1 | 5/2008 | Haring-Bolivar et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0168482 | A1 * | 7/2009 | Park ....................... G11O 5/02 365/51 |
| 2009/0184360 | A1 | 7/2009 | Jin et al. |
| 2009/0310415 | A1 | 12/2009 | Jin et al. |
| 2010/0007001 | A1 | 1/2010 | Wang et al. |
| 2010/0109164 | A1 | 5/2010 | Kang et al. |
| 2010/0270593 | A1 | 10/2010 | Lung et al. |
| 2011/0018051 | A1 | 1/2011 | Kim et al. |
| 2011/0031630 | A1 | 2/2011 | Hashimoto |
| 2011/0057321 | A1 | 3/2011 | Wang et al. |
| 2012/0068241 | A1 | 3/2012 | Sakuma et al. |
| 2012/0119283 | A1 | 5/2012 | Lee et al. |
| 2012/0182806 | A1 | 7/2012 | Chen et al. |
| 2013/0082341 | A1 | 4/2013 | Shimizu et al. |
| 2013/0341797 | A1 | 12/2013 | Lim |
| 2014/0264934 | A1 | 9/2014 | Chen |
| 2015/0003150 | A1 * | 1/2015 | Aritome ............ G11C 16/3427 365/185.02 |

OTHER PUBLICATIONS

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," IEEE Int'l Electron Devices Meeting, Dec. 11-13, 2006, 4 pages.

Lai et al., "Highly Reliable MA BE-SONOS (Metal-A12 03 Bandgap Engineered SONOS) Using a SiO2 Buffer Layer" VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Nowak et al., "Intrinsic fluctuations in Vertical NAND flash memories," 2012 Symposium on VLSI Technology, Digest of Technical Papers, pp. 21-22, Jun. 12-14, 2012.

Paul et al., "Impact of a Process Variation on Nanowire and Nanotube Device Performance," 2007 IEEE, pp. 2369-2376.

(56) References Cited

OTHER PUBLICATIONS

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
U.S. Appl. No. 14/309,622 entitled "Bandgap-engineered Memory With Multiple Charge Trapping Layers Storing Charge," by Hang-Ting Lue, filed Jun. 19, 2014, 108 pages.
U.S. Appl. No. 14/637,187 entitled "Vertical Thin-Channel Memory," by Hang-Ting Lue, filed on Mar. 3, 2015, 90 pages.
U.S. Appl. No. 14/637,204 entitled "U-Shaped Vertical Thin-Channel Memory," by Hang-Ting Lue, filed Mar. 3, 2015, 78 pages.
Wang, Michael, "Technology Trends on 3D-NAND Flash Storage", Impact 2011, Taipei, dated Oct. 20, 2011, found at www.impact.org.tw/2011/Files/NewsFile/201111110190.pdf.

\* cited by examiner

2ND SET OF
VOLTAGE
SWITCHING
VERTICAL GATE
TRANSISTORS A-H
238

EVEN LANDING PADS 247/ 251

3D VOLTAGE SWITCHING TRANSISTORS FOR 3D VERTICAL GATE MEMORY ARRAY

BACKGROUND OF THE INVENTION

NAND memory arrays use high voltage switching transistors to isolate the erase voltage from the array and from sense amplifiers. Although both read and program operations use relatively low voltages, an erase operation couples a high magnitude voltage to the array. Thus high voltage switching transistors electrically decouple the array from the sensing circuits to avoid junction breakdown.

Commonly, during the erase operation of a 2D NAND memory array, the potential is raised in the PWI region, the uppermost p-type region in a triple well. One typical 2D NAND memory array arrangement uses a group of 4 high voltage switching MOSFETs positioned outside of the PWI region to electrically decouple the array from the erase voltage.

In another 2D NAND memory array arrangement the PWI region is shared by the memory array and the 4 switching MOSFETs to prevent large voltage differences and allow the use of low voltage design rules for the 4 switching MOSFETs. This latter arrangement adds a high voltage MOSFET outside of the PWI region, reducing the number of high voltage MOSFETS from 4 to 1 and thereby reducing the total area, despite the additional transistor.

3D NAND memory architecture also benefits from high voltage switching transistors to protect sensing circuits from the high magnitude erase voltage. However, 3D NAND memory can lack the PWI region, which in 2D NAND memory architecture can reduce the area consumed by high voltage switching circuitry.

As a result, in 3D NAND memory architecture, the high voltage switching transistors lines consume a significant amount of area. In an example memory array with 8 bit lines, and 2 planar switching transistors per bit line, 16 planar switching transistors are required to electrically couple the bit lines to erase voltage lines or to program and read voltage lines.

It would be desirable to reduce the area consumed by switching transistors for a 3D NAND memory array.

BRIEF SUMMARY OF THE INVENTION

Various embodiments of the technology reduce the area consumed by switching transistors for a 3D NAND memory array, with 3D voltage switching transistors with reduced aggregate area in comparison with 2D voltage switching transistors such as transistors in the substrate. In some embodiments both the 3D NAND memory array and the 3D voltage switching transistors use a vertical gate memory configuration.

In one aspect of the technology, the integrated circuit comprises a 3D NAND array of memory transistors; a plurality of bit lines, with different ones of the plurality of bit lines electrically coupled to different parts of the 3D NAND array; and a plurality of transistor pairs with a stack of semiconductor layers. Different layers in the stack of semiconductor layers include different transistor pairs of the plurality of transistor pairs. Each of the plurality of transistor pairs includes first and second transistors with first, second, and third source/drain terminals. The first transistor includes the first and the third source/drain terminals, and the second transistor includes the second and the third source/drain terminals. The first source/drain terminal is electrically coupled to an erase voltage line. The second source/drain terminal is electrically coupled to a corresponding one of a plurality of program/read voltage lines. The third source/drain terminal is electrically coupled to a corresponding one of the plurality of bit lines.

In some embodiments of the technology, a first gate controls all of the first transistors of the plurality of transistor pairs, and a second gate controls all of the second transistors of the plurality of transistor pairs.

In some embodiments of the technology, the first gate controls whether the plurality of bit lines is electrically coupled to the first source/drain terminals of the plurality of transistor pairs, and the second gate controls whether the plurality of bit lines is electrically coupled to the second source/drain terminals of the plurality of transistor pairs.

In some embodiments of the technology, the 3D NAND array includes a plurality of stacks of semiconductor strips positioned as transistor channels of different ones of the memory transistors in the 3D NAND array, and the stack of semiconductor layers includes: a first stack of semiconductor strips positioned as transistor channels of different ones of the first transistors of the plurality of transistor pairs, and a second stack of semiconductor strips positioned as transistor channels of different ones of the second transistors of the plurality of transistor pairs.

In some embodiments of the technology, a plurality of plane positions are shared by the semiconductor strips in the first stack of semiconductor strips, the semiconductor strips in the second stack of semiconductor strips, and the semiconductor strips in the plurality of stacks of semiconductor strips.

In some embodiments of the technology, different bit lines in the plurality of bit lines are electrically coupled to different plane positions of the 3D NAND array.

Some embodiments of the technology further comprise circuitry generating a first set of voltages for the erase voltage line and a second set of voltages for the plurality of program/read voltage lines.

In some embodiments of the technology, the semiconductor strips of the first stack of semiconductor strips are electrically coupled to adjacent bit lines in the plurality of bit lines.

In some embodiments of the technology, the semiconductor strips of the first stack of semiconductor strips are electrically coupled to nonadjacent bit lines in the plurality of bit lines.

Some embodiments of the technology further comprise circuitry performing:

(i) turning on the first plurality of transistors and turning off the second plurality of transistors; and (ii) turning on the second plurality of transistors and turning off the first plurality of transistors.

Another aspect of the technology is a method of operating a plurality of bit lines electrically coupled to a 3D NAND array of memory transistors, with different ones of the plurality of bit lines electrically coupled to different parts of the 3D NAND array, comprising:

switchably electrically coupling the plurality of bit lines to one of:

(i) a first set of voltages via a first plurality of transistors for at least a first memory operation type of the 3D NAND array, the first plurality of transistors with a first stack of semiconductor strips; and (ii) a second set of voltages via a second plurality of transistors for at least a second memory operation type of the 3D NAND array, the second plurality of transistors with a second stack of semiconductor strips, the first memory operation type being different from the second memory operation type.

In some embodiments of the technology, the semiconductor strips in the first stack of semiconductor strips are positioned as transistor channels of different ones of the first plurality of transistors, the semiconductor strips in the second stack of semiconductor strips are positioned as transistor channels of different ones of the second plurality of transistors, and the 3D NAND array includes a plurality of stacks of semiconductor strips positioned as transistor channels of different ones of the memory transistors in the 3D NAND array. In one embodiment of the technology, a plurality of plane positions are shared by the semiconductor strips in the first stack of semiconductor strips, the semiconductor strips in the second stack of semiconductor strips, and the semiconductor strips in the plurality of stacks of semiconductor strips, wherein different ones of the plurality of plane positions correspond to different transistor channels.

In some embodiments of the technology, the first memory operation type includes erase, and the second memory operation type includes at least one of read and program. In some embodiments of the technology, the first memory operation type includes erase, and the second memory operation type includes read and program.

In some embodiments of the technology, different bit lines in the plurality of bit lines are electrically coupled to different planes of the 3D NAND array.

Some embodiments of the technology further comprise circuitry generating the first set of voltages for the first memory operation type and the second set of voltages for the second memory operation type.

In some embodiments of the technology, the semiconductor strips of the first stack of semiconductor strips are electrically coupled to adjacent bit lines in the plurality of bit lines.

In some embodiments of the technology, the semiconductor strips of the first stack of semiconductor strips are electrically coupled to nonadjacent bit lines in the plurality of bit lines. For example, read and/or program memory operations can be performed via even or odd bit lines/bit lines.

Some embodiments of the technology further comprise circuitry performing:
  (i) turning on the first plurality of transistors and turning off the second plurality of transistors to couple the first set of voltages to the plurality of bit lines for at least the first memory operation type; and
  (ii) turning on the second plurality of transistors and turning off the first plurality of transistors to couple the second set of voltages to the plurality of bit lines for at least the second memory operation type.

A further aspect of the technology is an integrated circuit comprising:
  a 3D NAND array of memory transistors; a plurality of bit lines, with different ones of the plurality of bit lines electrically coupled to different parts of the 3D NAND array; a first plurality of transistors with a first stack of semiconductor strips; and a second plurality of transistors with a second stack of semiconductor strips. The plurality of bit lines is switchably electrically coupled to only one of a plurality of sets of voltages. The plurality of sets of voltages includes at least:
  (i) a first set of voltages via the first plurality of transistors for at least a first memory operation type of the 3D NAND array; and
  (ii) a second set of voltages via the second plurality of transistors for at least a second memory operation type of the 3D NAND array, the first memory operation type being different from the second memory operation type.

Other aspects of the technology are methods of manufacturing an integrated circuit as disclosed.

Other features, aspects and advantages of the present invention can be seen on review the figures, the detailed description, and the claims which follow.

DETAILED DESCRIPTION OF THE INVENTION

Figure 1:
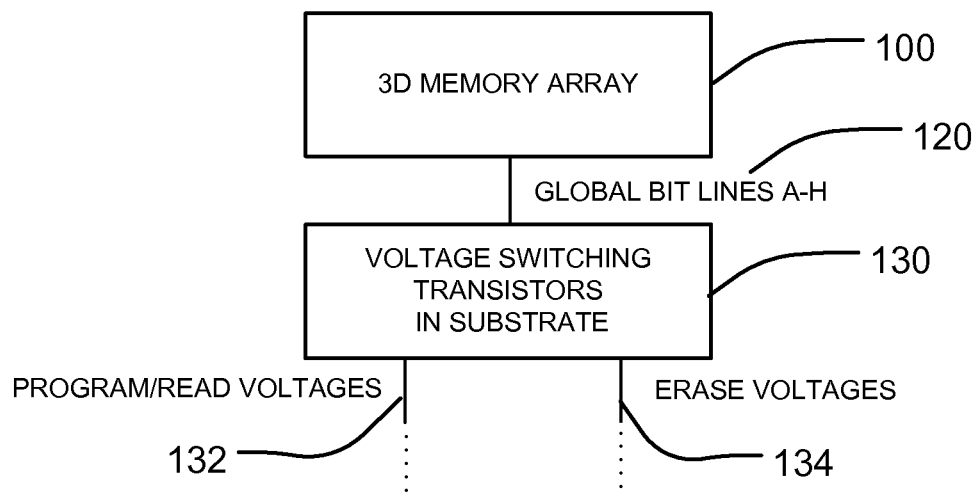
FIG. 1 is a block diagram of an integrated circuit with a 3D memory array and voltage switching transistors in the substrate.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a block diagram of an integrated circuit with a 3D memory array and voltage switching transistors in the substrate.

3D memory array 100 is coupled by global bit lines A-H 120 to voltage switching transistors in the substrate 130. Depending on how the transistors 130 are switched, the global bit lines A-H 120 are electrically coupled to program and read voltage lines carrying program and read voltages 132, or erase voltage lines carrying erase voltages 134.

Figure 2:
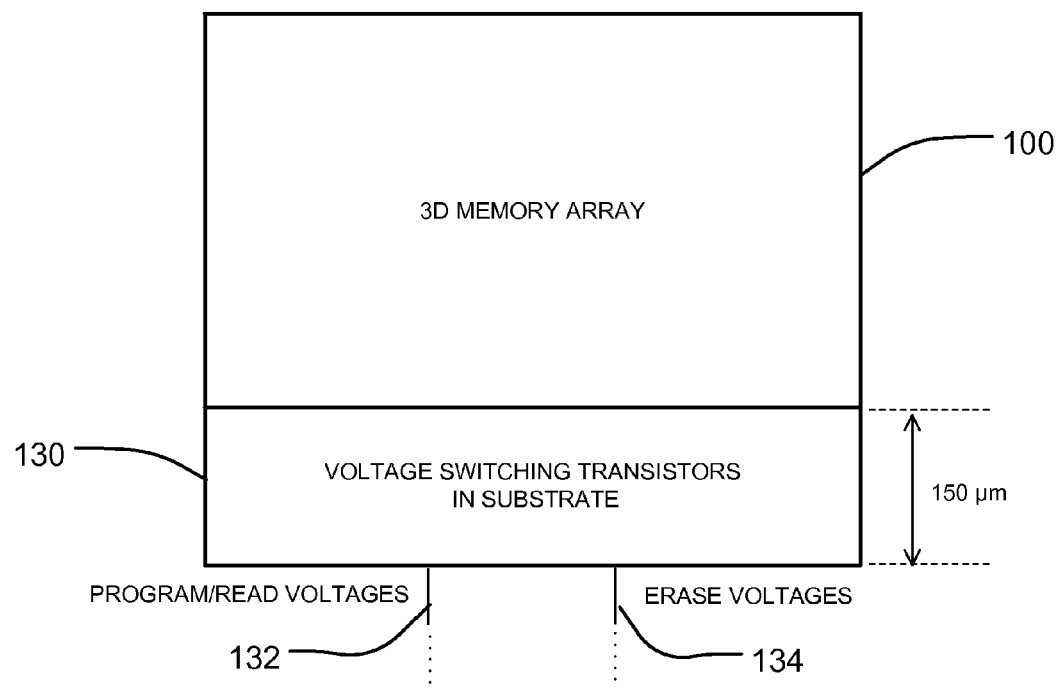
FIG. 2 is another block diagram of the integrated circuit of FIG. 1, showing a relatively large size of the voltage switching transistors in the substrate.

FIG. 2 is another block diagram of the integrated circuit of FIG. 1, showing a relatively large size of the voltage switching transistors in the substrate.

The voltage switching transistors in the substrate 130 are shown with an X-dimension corresponding to the X-dimension of the 3D memory array 100. The voltage switching transistors in the substrate 130 are shown with an aggregate Y-dimension of about 150 μm.

Figure 3:
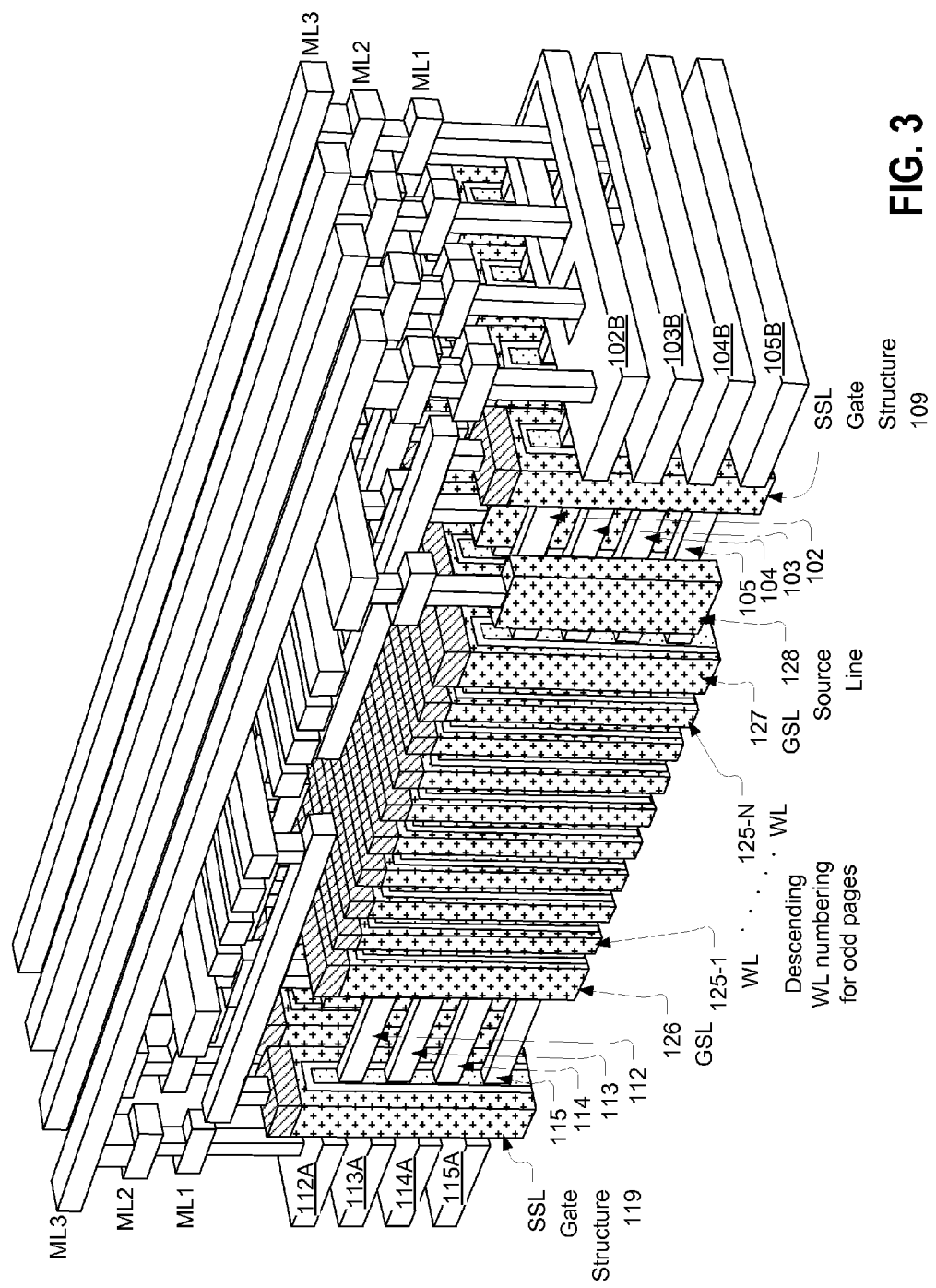
FIG. 3 is a perspective illustration of a 3D vertical gate NAND-flash memory 3D memory array, which is an example of the 3D memory array in FIG. 1.

FIG. 3 is a perspective illustration of a 3D vertical gate NAND-flash memory 3D memory array, which is an example of the 3D memory array in FIG. 1.

The device includes stacks of active lines in active layers of the array, alternating with insulating lines. Insulating material is removed from the drawing to expose additional structure. For example, insulating lines are removed from between the semiconductor lines in a same stack, and between the different stacks of semiconductor lines.

In the example, a multilayer array is formed on an insulating layer, and includes a plurality of word lines 125-1, . . . , 125-N conformal with the plurality of stacks. The plurality of stacks includes semiconductor lines 112, 113, 114, and 115 in multiple planes. Semiconductor lines in the same plane are electrically coupled together by bit line contact pads (e.g. 102B).

Bit line contact pads 112A, 113A, 114A, and 115A are on the near end of the figure and terminate semiconductor lines, such as semiconductor lines 112, 113, 114, and 115. As illustrated, these bit line contact pads 112A, 113A, 114A, and 115A are electrically connected by interlayer connectors to different bit lines in an overlying patterned metal layer, e.g. ML3, for connection to decoding circuitry to select planes within the array, via high voltage switching transistors. These bit line contact pads 112A, 113A, 114A, and 115A can be formed over stepped substrate structures, and patterned at the same time that the plurality of stacks is defined.

Bit line contact pads 102B, 103B, 104B, and 105B on the far end of the figure terminate semiconductor lines, such as semiconductor lines 102, 103, 104, and 105. As illustrated, these bit line contact pads 102B, 103B, 104B, and 105B are electrically connected by interlayer connectors to different bit lines in an overlying patterned metal layer, e.g. ML3, for connection to decoding circuitry to select planes within the array, via high voltage switching transistors. These bit line contact pads 102B, 103B, 104B, and 105B can be formed over stepped substrate structures, and patterned at the same time that the plurality of stacks is defined.

In this example, any given stack of semiconductor lines is coupled to either the bit line contact pads 112A, 113A, 114A, and 115A, or the bit line contact pads 102B, 103B, 104B, and 105B, but not both. A stack of semiconductor bit lines has one of the two opposite orientations of bit line end-to-source line end orientation, or source line end-to-bit line end orientation. For example, the stack of semiconductor lines 112, 113, 114, and 115 has bit line end-to-source line end orientation; and the stack of semiconductor lines 102, 103, 104, and 105 has source line end-to-bit line end orientation.

The stack of semiconductor lines 112, 113, 114, and 115 terminated by the bit line contact pads 112A, 113A, 114A, and 115A, passes through SSL gate structure 119, ground select line GSL 126, word lines 125-1 WL through 125-N WL, ground select line GSL 127, and is terminated at the other end by source line 128. The stack of semiconductor lines 112, 113, 114, and 115 does not reach the bit line structures 102B, 103B, 104B, and 105B.

The stack of semiconductor lines 102, 103, 104, and 105 terminated by the bit line contact pads 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of semiconductor lines 102, 103, 104, and 105 does not reach the bit line structures 112A, 113A, 114A, and 115A.

A layer of memory material is disposed in interface regions at cross-points between surfaces of the semiconductor lines 112-115 and 102-105 and the plurality of word lines 125-1 through 125-n. Ground select lines GSL 126 and GSL 127 are conformal with the plurality of stacks, similar to the word lines.

Every stack of semiconductor lines is terminated at one end by bit line contact pads and at the other end by a source line. For example, the stack of semiconductor lines 112, 113, 114, and 115 is terminated by bit line contact pads 112A, 113A, 114A, and 115A, and terminated on the other end by a source line 128.

Bit lines and string select lines are formed at the metal layers ML1, ML2, and ML3. Bit lines are coupled to a plane decoder (not shown) in the peripheral area on the circuit, via high voltage switching transistors. String select lines are coupled to a string select line decoder (not shown) in the peripheral area on the circuit.

The ground select lines GSL 126 and 127 can be patterned during the same step that the word lines 125-1 through 125-n are defined. Ground select devices are formed at cross-points between surfaces of the plurality of stacks and ground select lines GSL 126 and 127. The SSL gate structures 119 and 109 can be patterned during the same step that the word lines 125-1 through 125-n are defined. String select devices are formed at cross-points between surfaces of the plurality of stacks and string select (SSL) gate structures 119 and 109. These devices are coupled to decoding circuitry for selecting the strings within particular stacks in the array.

Figure 4:
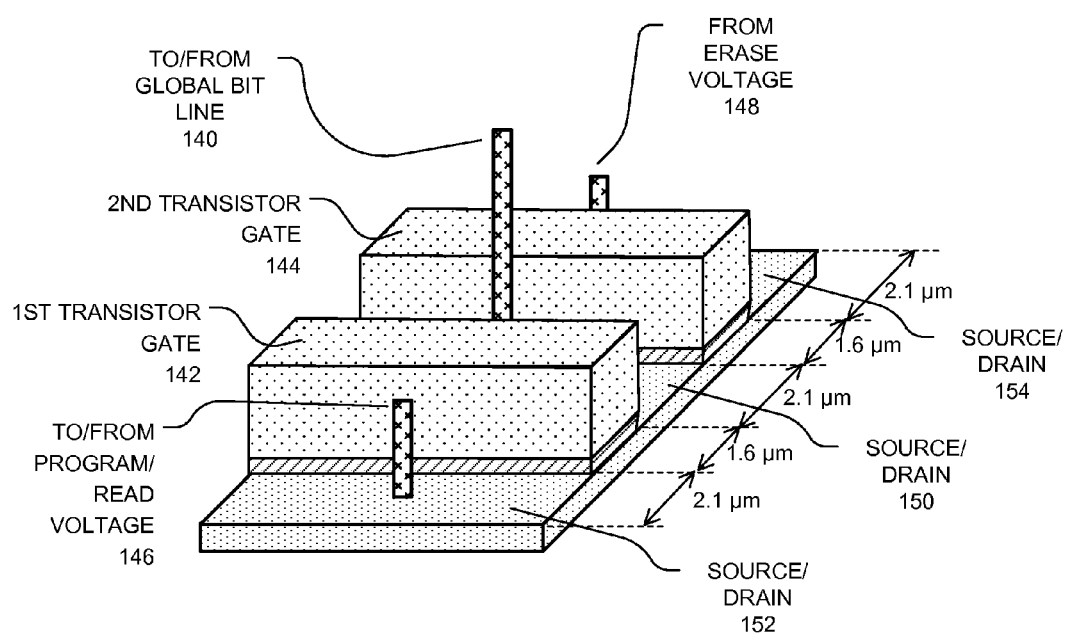
FIG. 4 is a perspective illustration of an example of a pair of voltage switching transistors in the substrate, which can be used in FIG. 1.

FIG. 4 is a perspective illustration of an example of a pair of voltage switching transistors in the substrate, which can be used in FIG. 1.

Conductive plug 140 electrically couples voltages between a global bit line and source/drain 150.

1st transistor gate 142 switchably electrically couples source/drain 150 and source/drain 152. When 1st transistor gate 142 receives an on voltage, then the 1st transistor electrically couples conductive plug 140 to conductive plug 146. When 1st transistor gate 142 receives an off voltage, then the 1st transistor electrically decouples conductive plug 140 from conductive plug 146. Conductive plug 146 is electrically coupled to a program and read voltage line carrying program and read voltages.

2nd transistor gate 144 switchably electrically couples source/drain 150 and source/drain 154. When 2nd transistor gate 144 receives an on voltage, then the 2nd transistor electrically couples conductive plug 140 to conductive plug 148. When 2nd transistor gate 144 receives an off voltage, then the 2nd transistor electrically decouples conductive plug 140 from conductive plug 148. Conductive plug 148 is electrically coupled to an erase voltage line carrying an erase voltage.

1st transistor gate 142 and 2nd transistor gate 144 of the voltage switching transistors in the substrate 130 are shown with a Y-dimension of about 1.6 µm. The Y-dimension corresponds to the gate length dimension. Source/drain 150, source/drain 152, and source/drain 154 are shown with a Y-dimension of about 2.1 µm.

Figure 5:
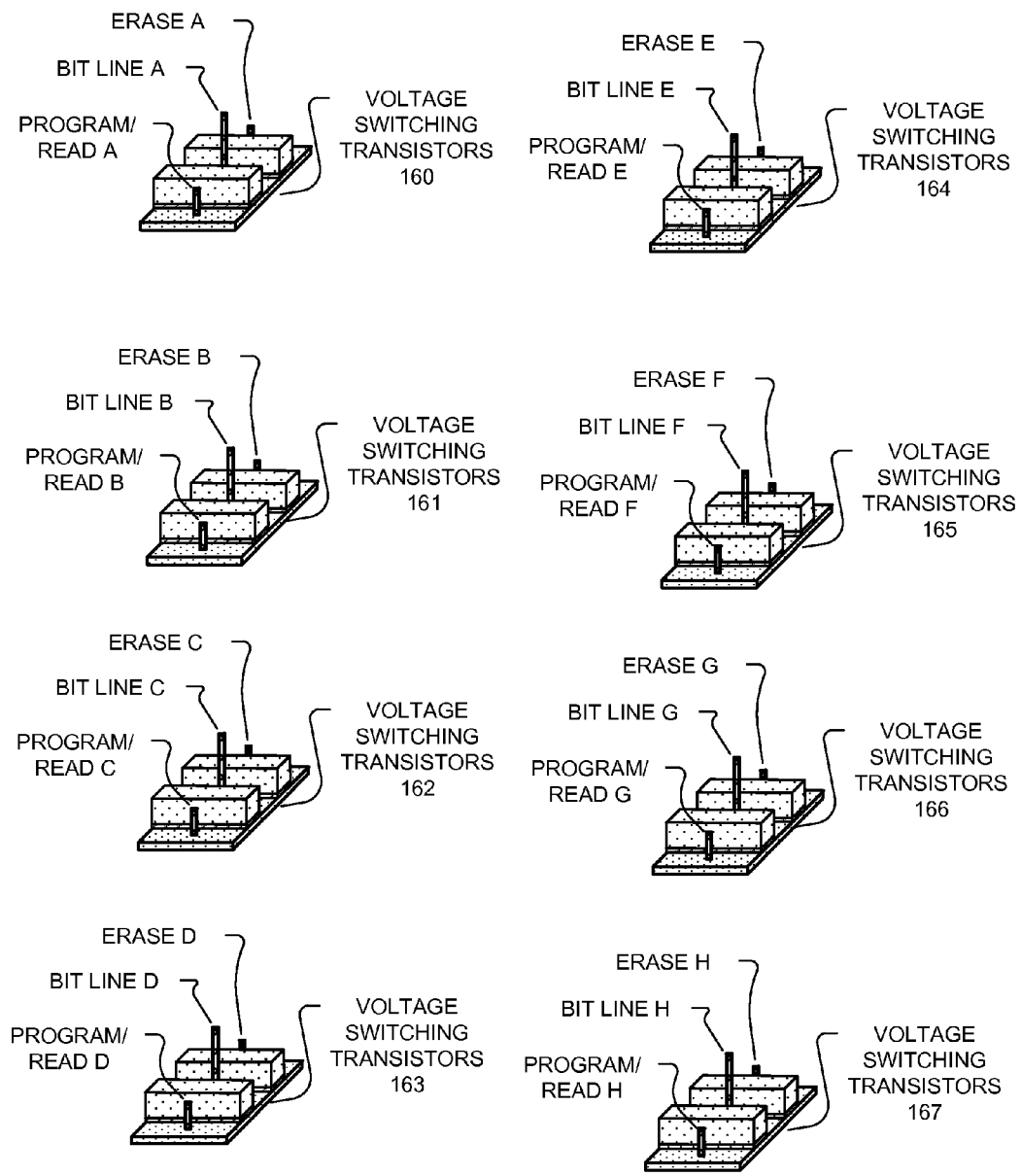
FIG. 5 is a perspective illustration of an example of multiple pairs of voltage switching transistors in the substrate, which can be used in FIG. 1.

FIG. 5 is a perspective illustration of an example of multiple pairs of voltage switching transistors in the substrate, which can be used in FIG. 1.

Each of the multiple pairs of voltage switching transistors 160-167 in the substrate can be an instance of the pair of voltage switching transistors in FIG. 4 electrically coupled to an erase voltage line, a respective bit line, and a respective program and read voltage line. These multiple instances of pairs of voltage switching transistors emphasize the amount of chip area taken up by voltage switching transistors in the substrate.

Figure 6:
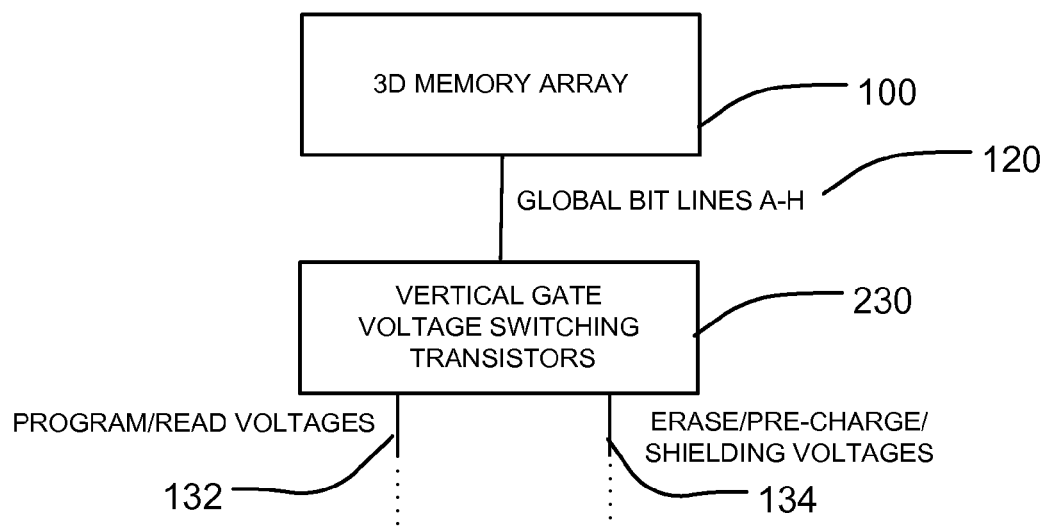
FIG. 6 is a block diagram of an integrated circuit with a 3D memory array and vertical gate voltage switching transistors.

FIG. 6 is a block diagram of an integrated circuit with a 3D memory array and vertical gate voltage switching transistors.

3D memory array 100 is coupled by global bit lines A-H 120 to vertical gate voltage switching transistors 230. Depending on how the transistors 230 are switched, the global bit lines A-H 120 are electrically coupled to program and read voltage lines carrying program and read voltages 132, or erase/pre-charge/shielding voltage lines carrying erase/pre-charge/shielding voltages 134. The pre-charge and shielding voltages are applicable during program and/or read modes.

In various embodiments, the erase/pre-charge/shielding voltage lines carrying erase/pre-charge/shielding voltages can be replaced with: erase/pre-charge voltage lines carrying erase/pre-charge voltages, erase/shielding voltage lines carrying erase/shielding voltages, or erase voltage lines carrying erase voltages. In various embodiments, the pre-charge and/or shielding voltages can be carried by another set or sets of voltage lines.

The vertical gate voltage switching transistors 230 separate the erase voltages from other circuits such as the sense amplifier.

Figure 7:
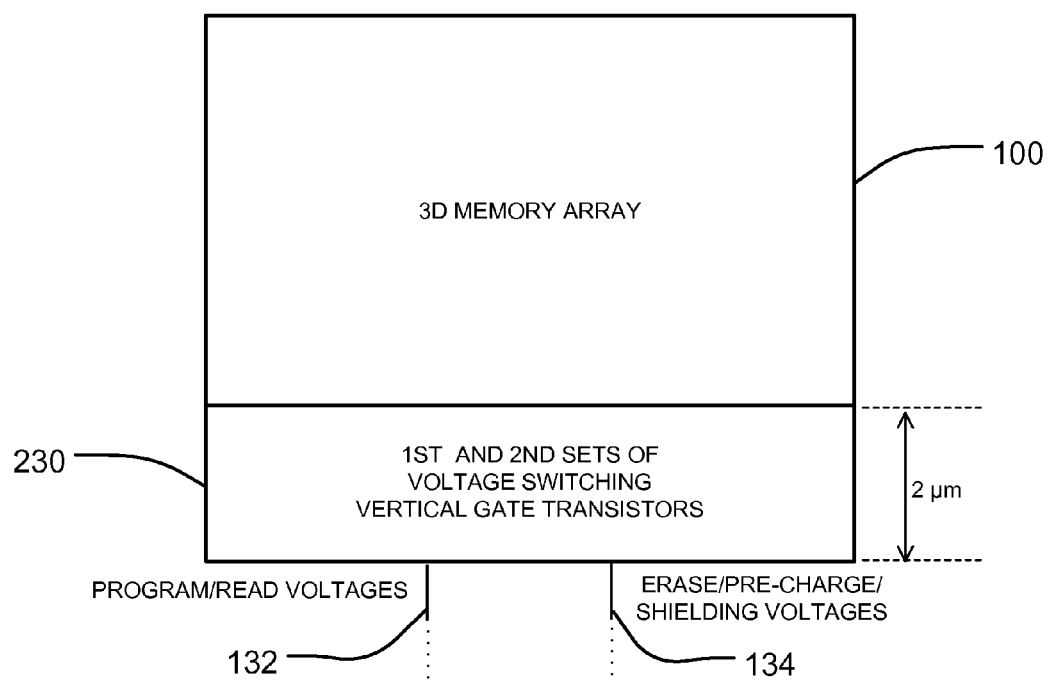
FIG. 7 is another block diagram of the integrated circuit of FIG. 6, showing a relatively small size of the vertical gate voltage switching transistors.

FIG. 7 is another block diagram of the integrated circuit of FIG. 6, showing a relatively small size of the vertical gate voltage switching transistors.

The vertical gate voltage switching transistors 230 are shown with an X-dimension corresponding to the X-dimension of the 3D memory array 100. The vertical gate voltage switching transistors 230 are shown with an aggregate Y-dimension of about 2 µm, substantially smaller than the aggregate Y-dimension of about 150 µm for the embodiment with voltage switching transistors in the substrate.

The semiconductor stacks in the 3D memory array 100 and the semiconductor stacks in the vertical gate voltage switching transistors 230 can share forming and patterning manufacturing steps, such that additional manufacturing steps are not required by the vertical gate voltage switching transistors 230 beyond those required for the 3D memory array 100.

Figure 8:
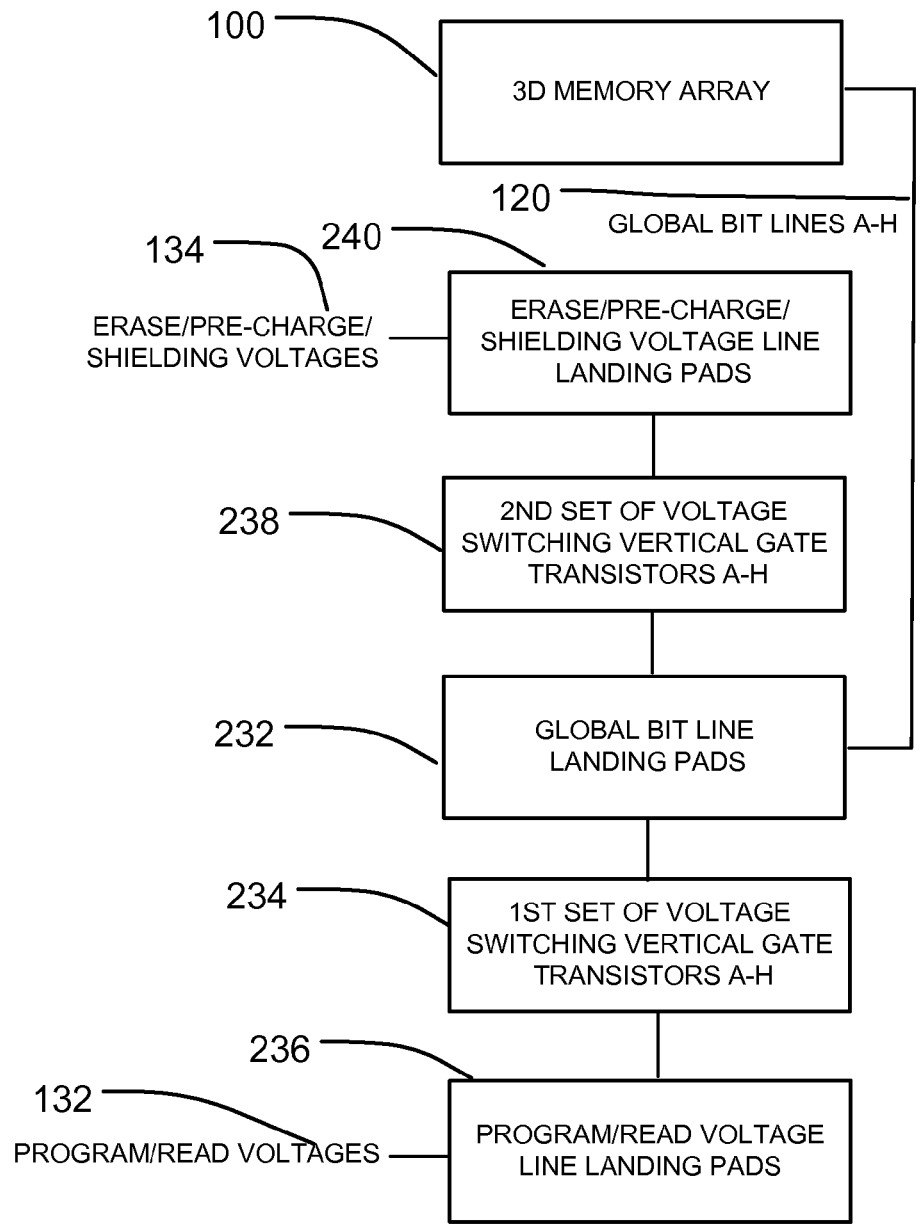
FIG. 8 is a more detailed block diagram of the integrated circuit of FIG. 6, further showing multiple sets of vertical gate voltage switching transistors and multiple sets of landing pads.

FIG. 8 is a more detailed block diagram of the integrated circuit of FIG. 6, further showing multiple sets of vertical gate voltage switching transistors and multiple sets of landing pads.

3D memory array 100 is coupled by global bit lines A-H 120 to global bit line landing pads 232. The global bit line landing pads 232 are electrically coupled to one of the source/drain terminals of both the 1st set of vertical gate voltage switching transistors 234 and the 2nd set of vertical gate voltage switching transistors 238.

1st set of vertical gate voltage switching transistors 234 switchably electrically couples global bit line landing pads 232 and program and read voltage line landing pads 236. When the 1st set of vertical gate voltage switching transistors 234 is turned on, the 1st set of vertical gate voltage switching transistors 234 electrically couples global bit line landing pads 232 to program and read voltage line landing pads 236. When the 1st set of vertical gate voltage switching transistors 234 is turned off, the 1st set of vertical gate voltage switching transistors 234 electrically decouple global bit line landing pads 232 from program and read voltage line landing pads 236. Program and read voltage line landing pads 236 are electrically coupled to program and read voltage lines carrying program and read voltages 132.

2nd set of vertical gate voltage switching transistors 238 switchably electrically couples global bit line landing pads 232 and erase/pre-charge/shielding voltage line landing pads 240. When the 2nd set of vertical gate voltage switching transistors 238 is turned on, the 2nd set of vertical gate voltage switching transistors 238 electrically couples global bit line landing pads 232 to erase/pre-charge/shielding voltage line landing pads 240. When the 2nd set of vertical gate voltage switching transistors 238 is turned off, the 2nd set of vertical gate voltage switching transistors 238 electrically decouple global bit line landing pads 232 from erase/pre-charge/shielding voltage line landing pads 240. Erase/pre-charge/shielding voltage line landing pads 240 are electrically coupled to erase/pre-charge/shielding voltage lines carrying erase/pre-charge/shielding voltages 134.

The 1st set of vertical gate voltage switching transistors 234 and the 2nd set of vertical gate voltage switching transistors 238 separate the erase/pre-charge/shielding voltages on erase/pre-charge/shielding lines 134 from other circuits such as the sense amplifier connected via program and read voltage lines 132.

Figure 9:
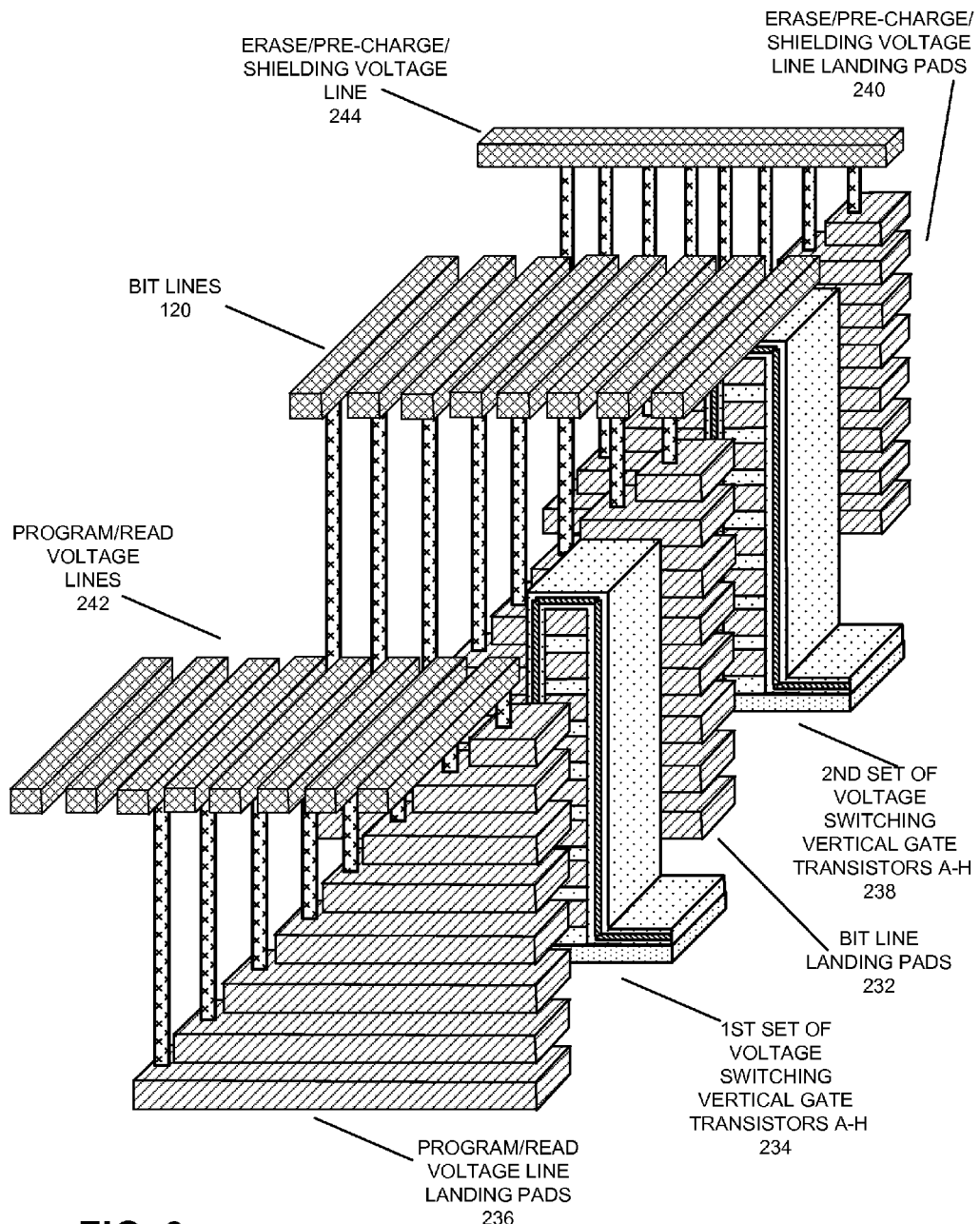
FIG. 9 is a perspective illustration of an example of the integrated circuit of FIG. 8.

FIG. 9 is a perspective illustration of an example of the integrated circuit of FIG. 8.

The aggregated blocks in FIG. 9 are shown individually for easier viewing in FIGS. 10-14. A 3D memory array (not shown) is coupled by global bit lines 120 to global bit line landing pads 232. The global bit line landing pads 232 are electrically coupled to one of the source/drain terminals of both the 1st set of vertical gate voltage switching transistors 234 and the 2nd set of vertical gate voltage switching transistors 238. 1st set of vertical gate voltage switching transistors 234 switchably electrically couples global bit line landing pads 232 and program and read voltage line landing pads 236. Program and read voltage line landing pads 236 are electrically coupled to program and read voltage lines 242 carrying program and read voltages. 2nd set of vertical gate voltage switching transistors 238 switchably electrically couples global bit line landing pads 232 and erase/pre-charge/shielding voltage line landing pads 240. Erase/pre-charge/shielding voltage line landing pads 240 are electrically coupled to erase/pre-charge/shielding voltage line 244 carrying an erase/pre-charge/shielding voltage.

In the structures of the different blocks, insulating layers such as in the stacks of semiconductor strips can be the same as or different from the other layers. Representative insulating materials that can be used include a silicon oxide, a silicon nitride, a silicon oxynitride, silicate, or other materials. Low dielectric constant (low-k) materials having a dielectric constant smaller than that of silicon dioxide, such as $SiCHO_x$, can be used. High dielectric constant (high-k) materials having a dielectric constant greater than that of silicon dioxide, such as $HfO_x$, HfON, $AlO_x$, $RuO_x$, $TiO_x$, can be used also.

In the structures of the different blocks, semiconductor layers such as in the stacks of semiconductor strips can be the same as or different from the other layers. Representative materials that can be used include semiconductors including undoped and doped polysilicon (using dopants such as As, P, B), combinations of semiconductor structures, silicides including TiSi, CoSi, oxide semiconductors, including InZnO, InGaZnO, and combinations of semiconductors and silicides.

In the structures of the different blocks, conductive layers such as in the bit lines and conductive plugs can be a metal, a conductive compound, or combinations of materials including Al, Cu, W, Ti, Co, Ni, TiN, TaN, TaAlN, and others. Conductive layers can also be semiconductor layers doped to be conductive rather than show semiconductor behavior.

The number of landing pads, semiconductor strips, and voltage lines can be adjusted according to the capacity of the 3D memory array.

Figure 10:
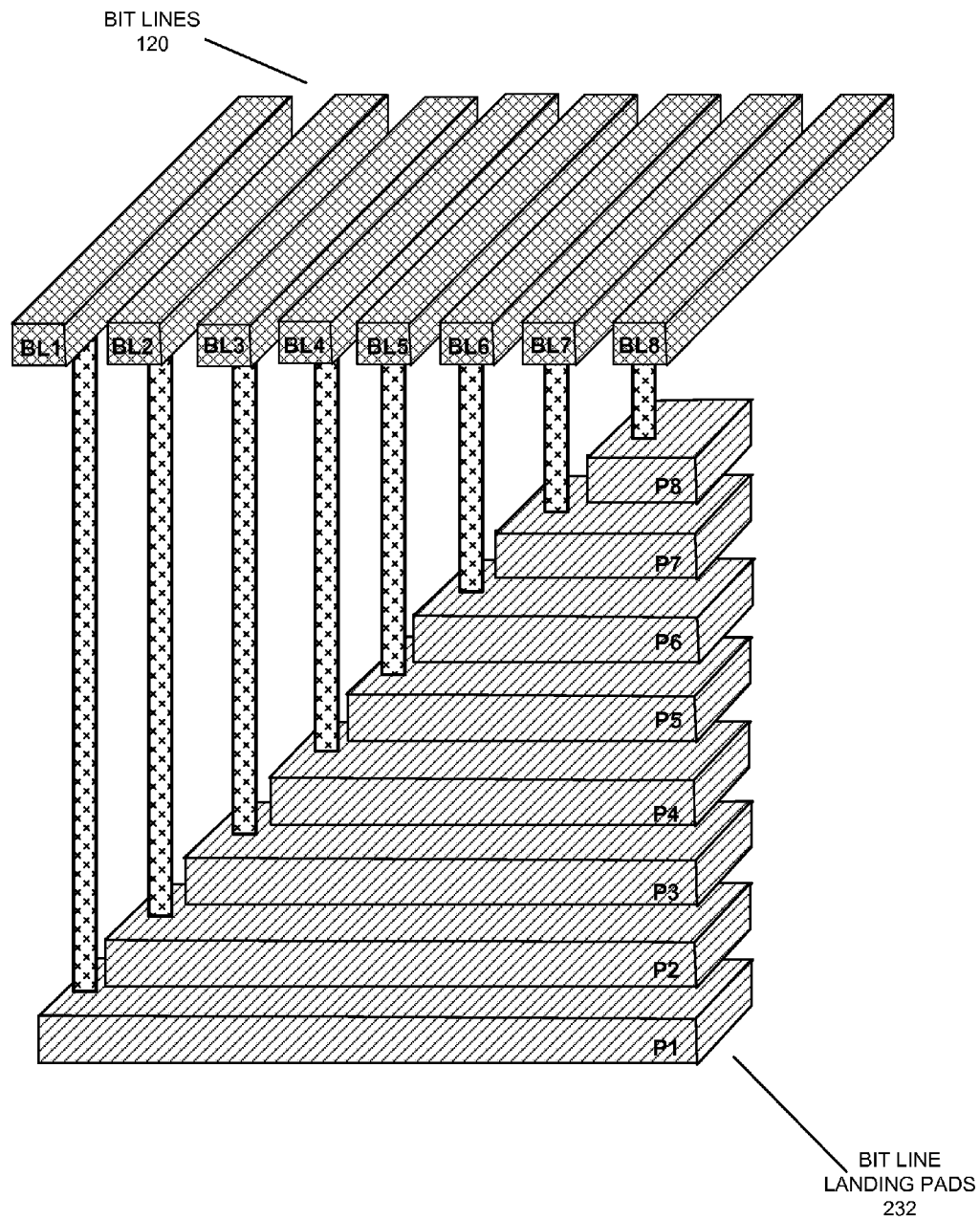
FIG. 10 is a perspective illustration of an example of the bit lines and bit line landing pads in the integrated circuit of FIG. 9.

FIG. 10 is a perspective illustration of an example of the bit lines and bit line landing pads in the integrated circuit of FIG. 9.

A 3D memory array (not shown) is coupled by global bit lines 120 to global bit line landing pads 232. The global bit lines 120 are conductive lines electrically coupled by a set of conductive plugs to respective ones of the global bit line landing pads 232. For example, bit lines BL1-BL8 are each electrically coupled to a respective one of the semiconductor strips P1-P8 in global bit line landing pads 232. Adjacent ones of the semiconductor strips P1-P8 in global bit line landing pads 232 are insulated from each other by intermediate insulating strips.

Figure 11:
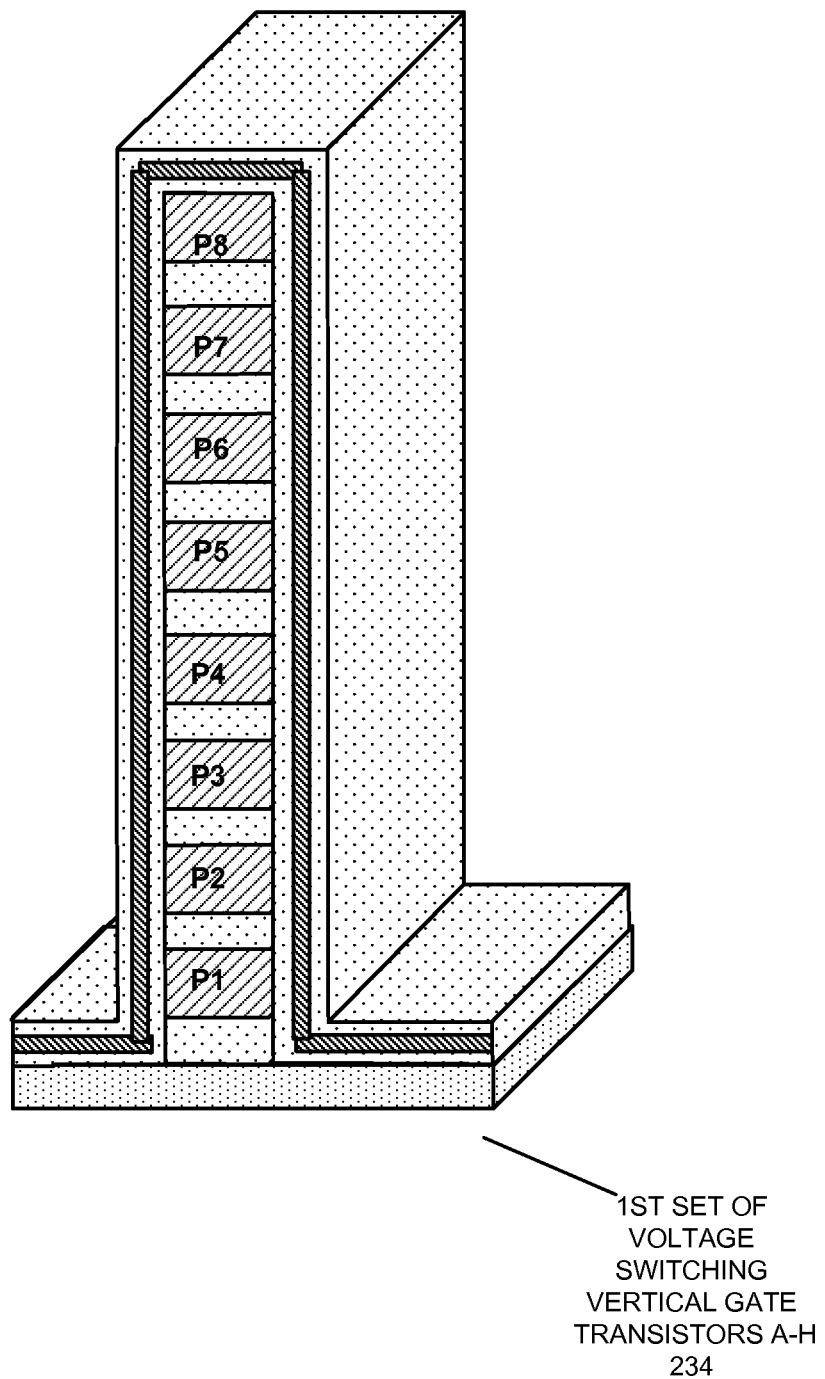
FIG. 11 is a perspective illustration of an example of the first set of voltage switching vertical gate transistors in the integrated circuit of FIG. 9.

FIG. 11 is a perspective illustration of an example of the first set of voltage switching vertical gate transistors in the integrated circuit of FIG. 9.

1st set of vertical gate voltage switching transistors 234 switchably electrically couples global bit line landing pads 232 and program and read voltage line landing pads 236. 1st set of vertical gate voltage switching transistors 234 includes semiconductor strips P1-P8 insulated from each other by intermediate insulating strips. The 1st set of vertical gate voltage switching transistors 234 can be covered by oxide to separate the semiconductor strips P1-P8 acting as channels from a covering conductive gate material. The oxide can be multilayer, such as silicon oxide/silicon nitride, silicon oxide (ONO), silicon oxide, high-k dielectric, silicon oxide (O/high-k/O), which provide higher k values and create less concern about capacitance leakage.

Figure 12:
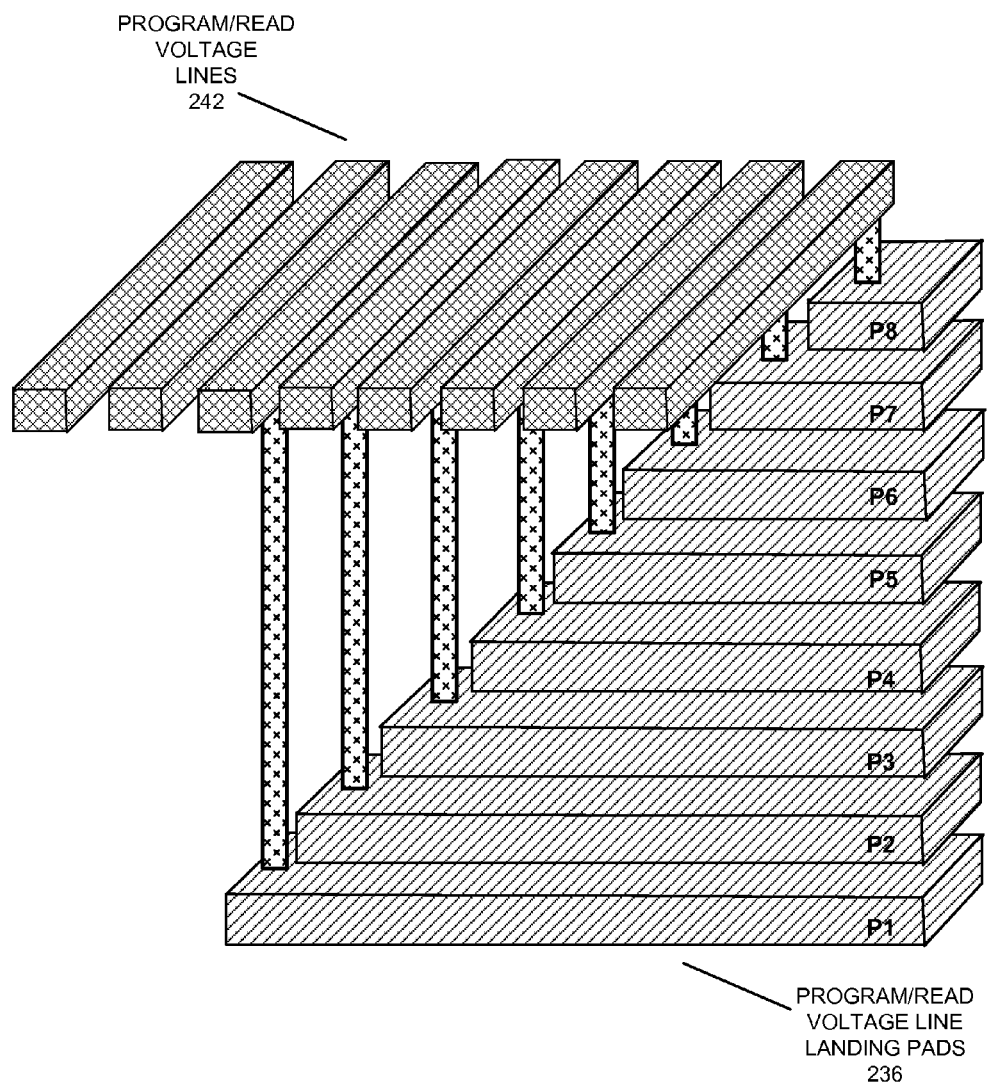
FIG. 12 is a perspective illustration of an example of the program and read voltage lines and program and read voltage line landing pads in the integrated circuit of FIG. 9.

FIG. 12 is a perspective illustration of an example of the program and read voltage lines and program and read voltage line landing pads in the integrated circuit of FIG. 9.

Program and read voltage lines 242 are conductive lines electrically coupled by a set of conductive plugs to respective ones of the program and read voltage line landing pads 236. Adjacent ones of the semiconductor strips P1-P8 in program and read voltage line landing pads 236 are insulated from each other by intermediate insulating strips.

When the 1st set of vertical gate voltage switching transistors 234 receives an on gate voltage, the semiconductor strips P1-P8 in global bit line landing pads 232 are electrically coupled to the semiconductor strips P1-P8 in program and read voltage line landing pads 236. For example, semiconductor strip P1 in global bit line landing pads 232 is electrically coupled to the semiconductor strip P1 in program and read voltage line landing pads 236, and so on for the other planes of semiconductor strips.

When the 1st set of vertical gate voltage switching transistors 234 receives an off gate voltage, the semiconductor strips P1-P8 in global bit line landing pads 232 are electrically decoupled from the semiconductor strips P1-P8 in program and read voltage line landing pads 236. For example, semiconductor strip P1 in global bit line landing pads 232 is electrically decoupled from the semiconductor strip P1 in program and read voltage line landing pads 236, and so on for the other planes of semiconductor strips.

Figure 13:
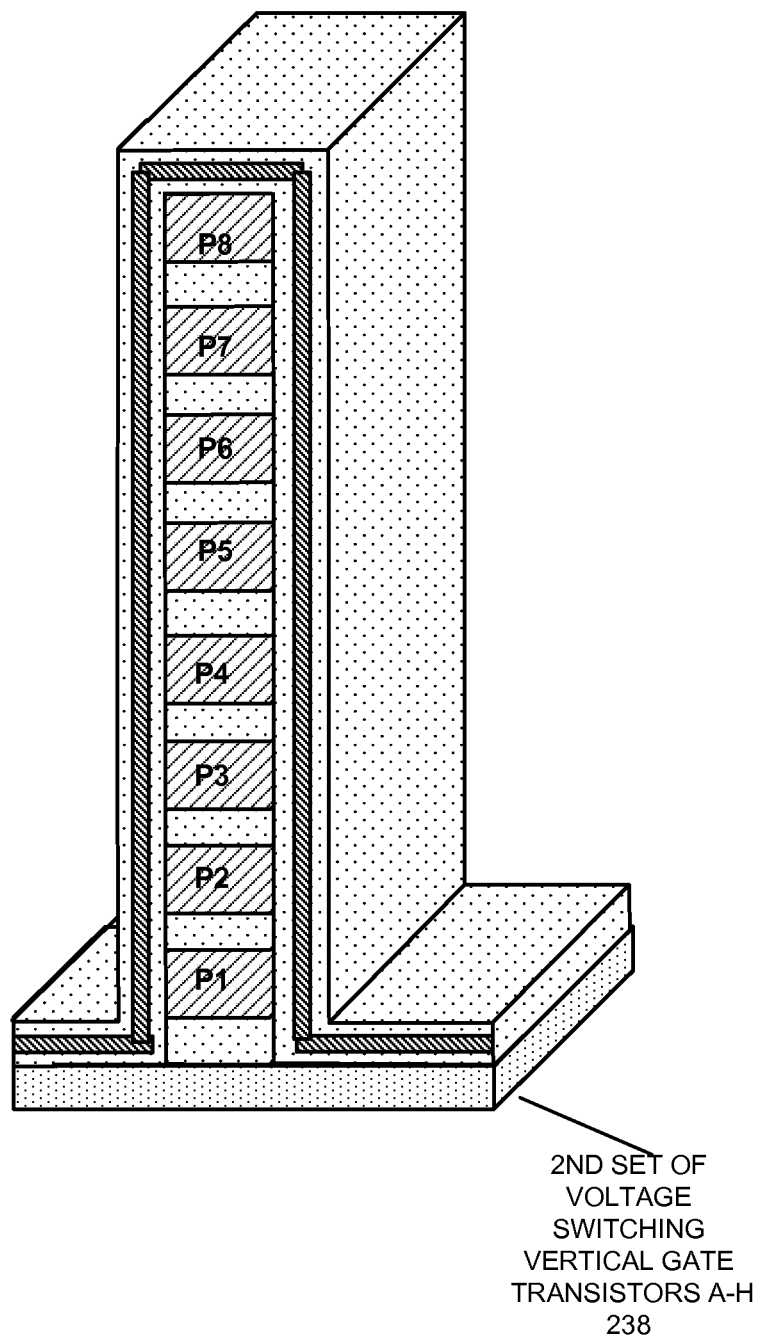
FIG. 13 is a perspective illustration of an example of the second set of voltage switching vertical gate transistors in the integrated circuit of FIG. 9.

FIG. 13 is a perspective illustration of an example of the second set of voltage switching vertical gate transistors in the integrated circuit of FIG. 9.

2nd set of vertical gate voltage switching transistors 238 switchably electrically couples global bit line landing pads 232 and erase/pre-charge/shielding voltage line landing pads 240. Otherwise, the 2nd set of vertical gate voltage switching transistors 238 can be similar to 1st set of vertical gate voltage switching transistors 234.

Figure 14:
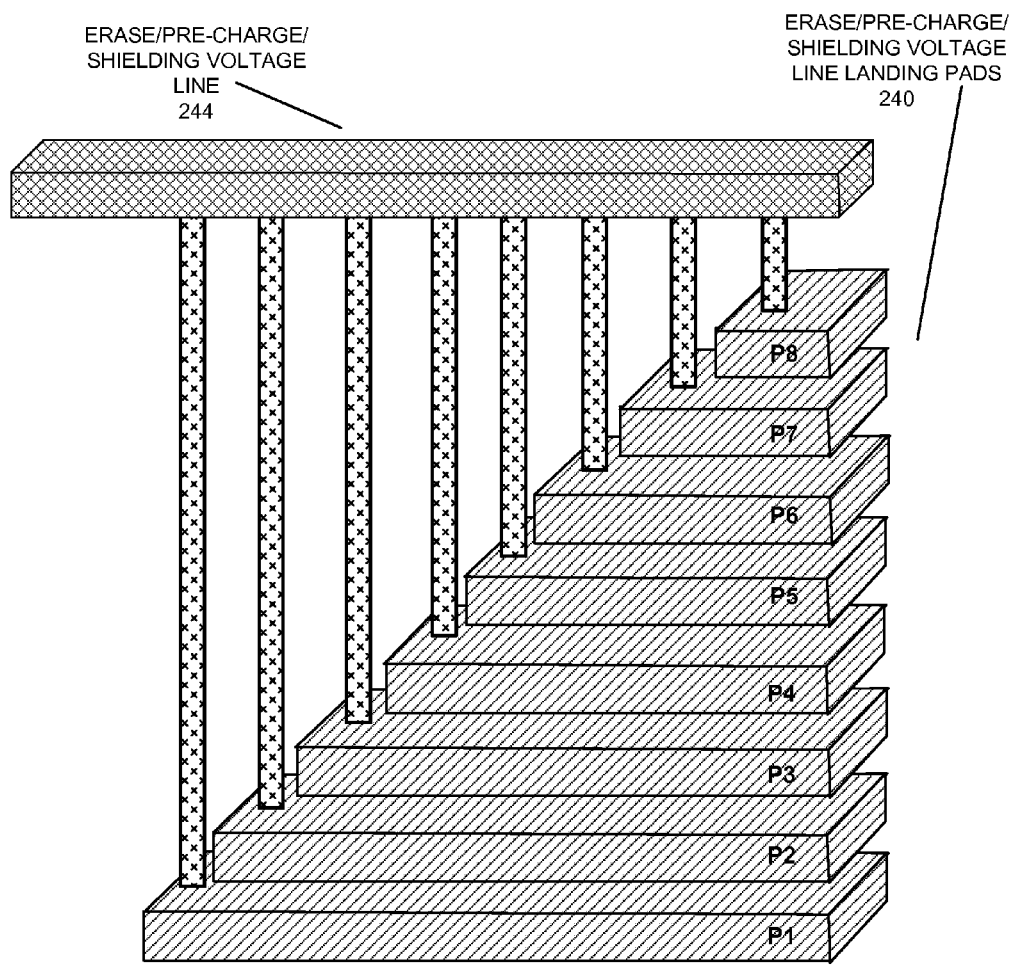
FIG. 14 is a perspective illustration of an example of the erase voltage line and erase voltage line landing pads in the integrated circuit of FIG. 9.

FIG. 14 is a perspective illustration of an example of the erase/pre-charge/shielding voltage line and erase/pre-charge/shielding voltage line landing pads in the integrated circuit of FIG. 9.

Erase/pre-charge/shielding voltage line 244 is a conductive line electrically coupled by a set of conductive plugs to the erase/pre-charge/shielding voltage line landing pads 240. Adjacent ones of the semiconductor strips P1-P8 in erase/pre-charge/shielding voltage line landing pads 240 are insulated from each other by intermediate insulating strips.

When the 2nd set of vertical gate voltage switching transistors 238 receives an on gate voltage, the semiconductor strips P1-P8 in global bit line landing pads 232 are electrically coupled to the semiconductor strips P1-P8 in erase/pre-charge/shielding voltage line landing pads 240. For example, semiconductor strip P1 in global bit line landing pads 232 is electrically coupled to the semiconductor strip P1 in erase/pre-charge/shielding voltage line landing pads 240, and so on for the other planes of semiconductor strips.

When the 2nd set of vertical gate voltage switching transistors 238 receives an off gate voltage, the semiconductor strips P1-P8 in global bit line landing pads 232 are electrically decoupled from the semiconductor strips P1-P8 in erase/pre-charge/shielding voltage line landing pads 240. For example, semiconductor strip P1 in global bit line landing pads 232 is electrically decoupled from the semiconductor strip P1 in erase/pre-charge/shielding voltage line landing pads 240, and so on for the other planes of semiconductor strips.

Figure 15:
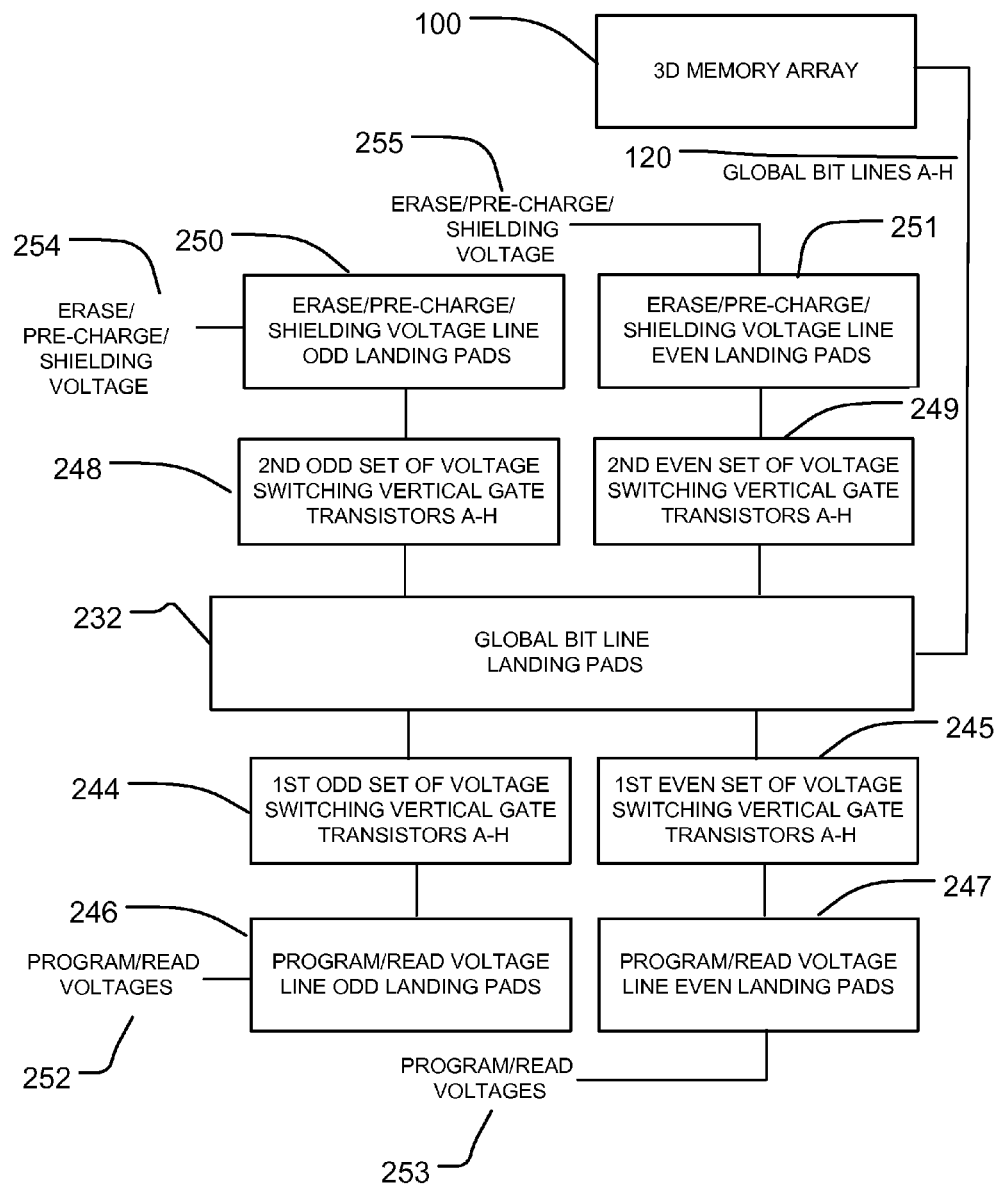
FIG. 15 is an alternative detailed block diagram of the integrated circuit of FIG. 6, showing even and odd access of bit lines rather than all bit line access as in FIG. 8.

FIG. 15 is an alternative detailed block diagram of the integrated circuit of FIG. 6, showing even and odd access of bit lines rather than all bit line access as in FIG. 8.

3D memory array 100 is coupled by global bit lines A-H 120 to global bit line landing pads 232. The global bit line landing pads 232 are electrically coupled to one of the source/drain terminals of four sets of transistors: 1st odd set of vertical gate voltage switching transistors 244, 1st even set of vertical gate voltage switching transistors 245, 2nd odd set of vertical gate voltage switching transistors 248, and 2nd even set of vertical gate voltage switching transistors 249.

1st odd set of vertical gate voltage switching transistors 244 switchably electrically couples global bit line landing pads 232 and program and read voltage line odd landing pads 246. When the 1st odd set of vertical gate voltage switching transistors 244 is turned on, the 1st odd set of vertical gate voltage switching transistors 244 electrically couples global bit line landing pads 232 to program and read voltage line odd landing pads 246. When the 1st odd set of vertical gate voltage switching transistors 244 is turned off, the 1st odd set of vertical gate voltage switching transistors 244 electrically decouples global bit line landing pads 232 from program and read voltage line odd landing pads 246. Program and read voltage line odd landing pads 246 are electrically coupled to odd program and read voltage lines carrying program and read voltages 252.

1st even set of vertical gate voltage switching transistors 245 switchably electrically couples global bit line landing pads 232 and program and read voltage line even landing pads 247. When the 1st even set of vertical gate voltage switching transistors 245 is turned on, the 1st even set of vertical gate voltage switching transistors 245 electrically couples global bit line landing pads 232 to program and read voltage line even landing pads 247. When the 1st even set of vertical gate voltage switching transistors 245 is turned off, the 1st even set of vertical gate voltage switching transistors 245 electrically decouples global bit line landing pads 232 from program and read voltage line even landing pads 247. Program and read voltage line even landing pads 247 are electrically coupled to even program and read voltage lines carrying program and read voltages 253.

2nd odd set of vertical gate voltage switching transistors 248 switchably electrically couples global bit line landing pads 232 and erase/pre-charge/shielding voltage line odd landing pads 250. When the 2nd odd set of vertical gate voltage switching transistors 248 is turned on, the 2nd odd set of vertical gate voltage switching transistors 248 electrically couples global bit line landing pads 232 to erase/pre-charge/shielding voltage line odd landing pads 250. When the 2nd odd set of vertical gate voltage switching transistors 248 is turned off, the 2nd odd set of vertical gate voltage switching transistors 248 electrically decouples global bit line landing pads 232 from erase/pre-charge/shielding voltage line odd landing pads 250. Erase/pre-charge/shielding voltage line odd landing pads 250 are electrically coupled to an odd erase/pre-charge/shielding voltage line carrying an erase/pre-charge/shielding voltage 254.

2nd even set of vertical gate voltage switching transistors 249 switchably electrically couples global bit line landing pads 232 and erase/pre-charge/shielding voltage line even landing pads 251. When the 2nd even set of vertical gate voltage switching transistors 249 is turned on, the 2nd even set of vertical gate voltage switching transistors 249 electrically couples global bit line landing pads 232 to erase/pre-charge/shielding voltage line even landing pads 251. When the 2nd even set of vertical gate voltage switching transistors 249 is turned off, the 2nd even set of vertical gate voltage switching transistors 249 electrically decouples global bit line landing pads 232 from erase/pre-charge/shielding voltage line even landing pads 251. Erase/pre-charge/shielding voltage line even landing pads 251 are electrically coupled to an even erase/pre-charge/shielding voltage line carrying an erase/pre-charge/shielding voltage 255.

1st odd set of vertical gate voltage switching transistors 244, 1st even set of vertical gate voltage switching transistors 245, 2nd odd set of vertical gate voltage switching transistors 248, and 2nd even set of vertical gate voltage switching transistors 249 can be similar to 1st set of vertical gate voltage switching transistors 234 in FIGS. 11 and 2nd set of vertical gate voltage switching transistors 238 in FIG.

13. Alternatively, because only odd or only even semiconductor strips are required, every other semiconductor strip can be replaced with another material.

The 1st odd set of vertical gate voltage switching transistors 244, 1st even set of vertical gate voltage switching transistors 245, 2nd odd set of vertical gate voltage switching transistors 248, and 2nd even set of vertical gate voltage switching transistors 249 separate the erase/pre-charge/shielding voltages on erase/pre-charge/shielding lines 254 and 255 from other circuits such as the sense amplifier connected via program and read voltage lines 252 and 253.

Figure 16:
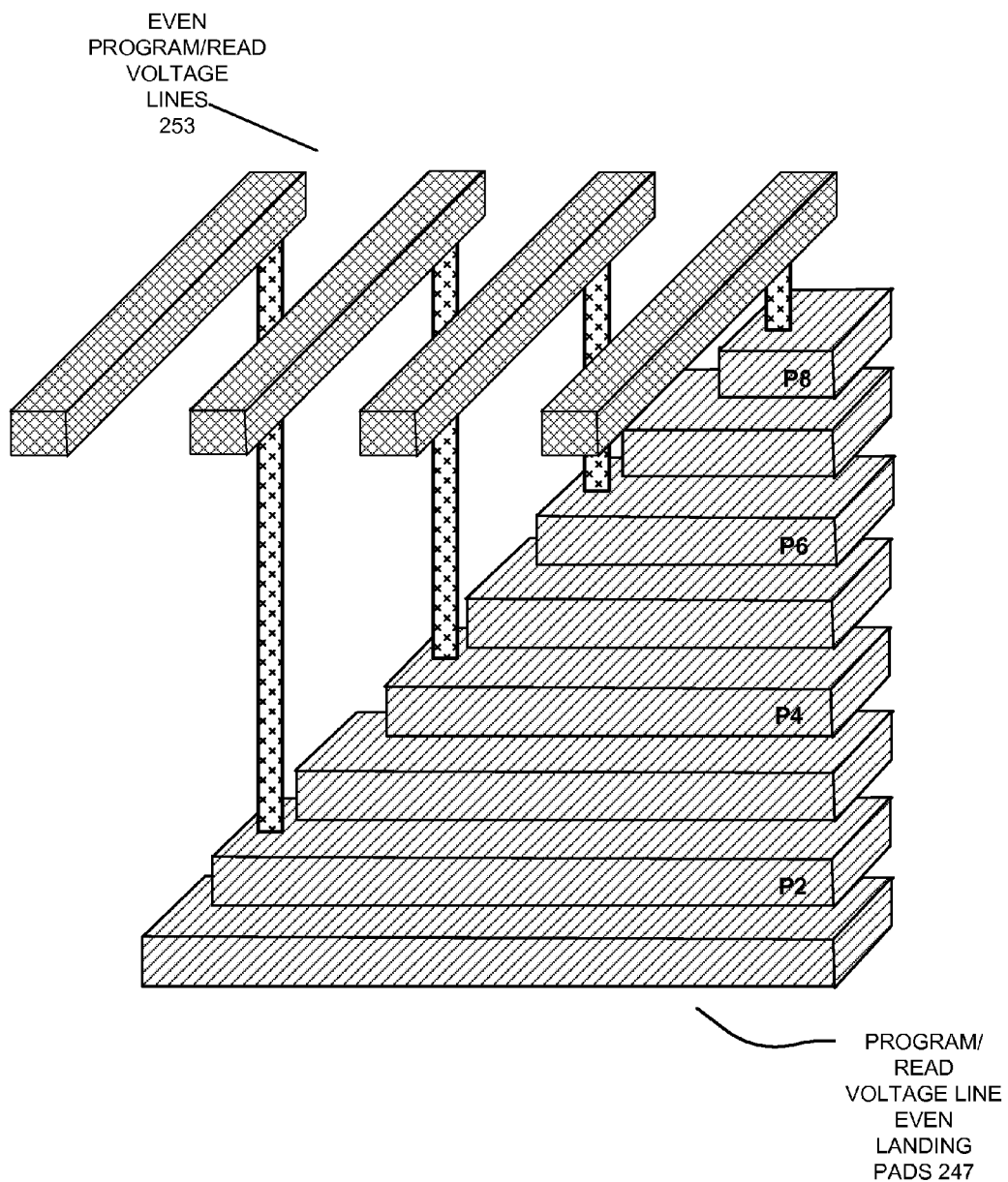
FIG. 16 is a perspective illustration of an example of the program and read voltage lines and program and read voltage line landing pads in the integrated circuit of FIG. 15, with even access of bit lines rather than all bit line access as in FIG. 12.

FIG. 16 is a perspective illustration of an example of the program and read voltage lines and program and read voltage line landing pads in the integrated circuit of FIG. 15, with even access of bit lines rather than all bit line access as in FIG. 12.

Even program and read voltage lines 253 are conductive lines electrically coupled by a set of conductive plugs to respective ones of the even program and read voltage line landing pads 247, including semiconductor strips P2, P4, P6, and P8.

Otherwise, the even program and read voltage lines 253 can be similar to program and read voltage lines 242, and even program and read voltage line landing pads 247 can be similar to program and read voltage line landing pads 236 of FIG. 12. Alternatively, the semiconductor strips other than P2, P4, P6, and P8 can be replaced with other material.

Figure 17:
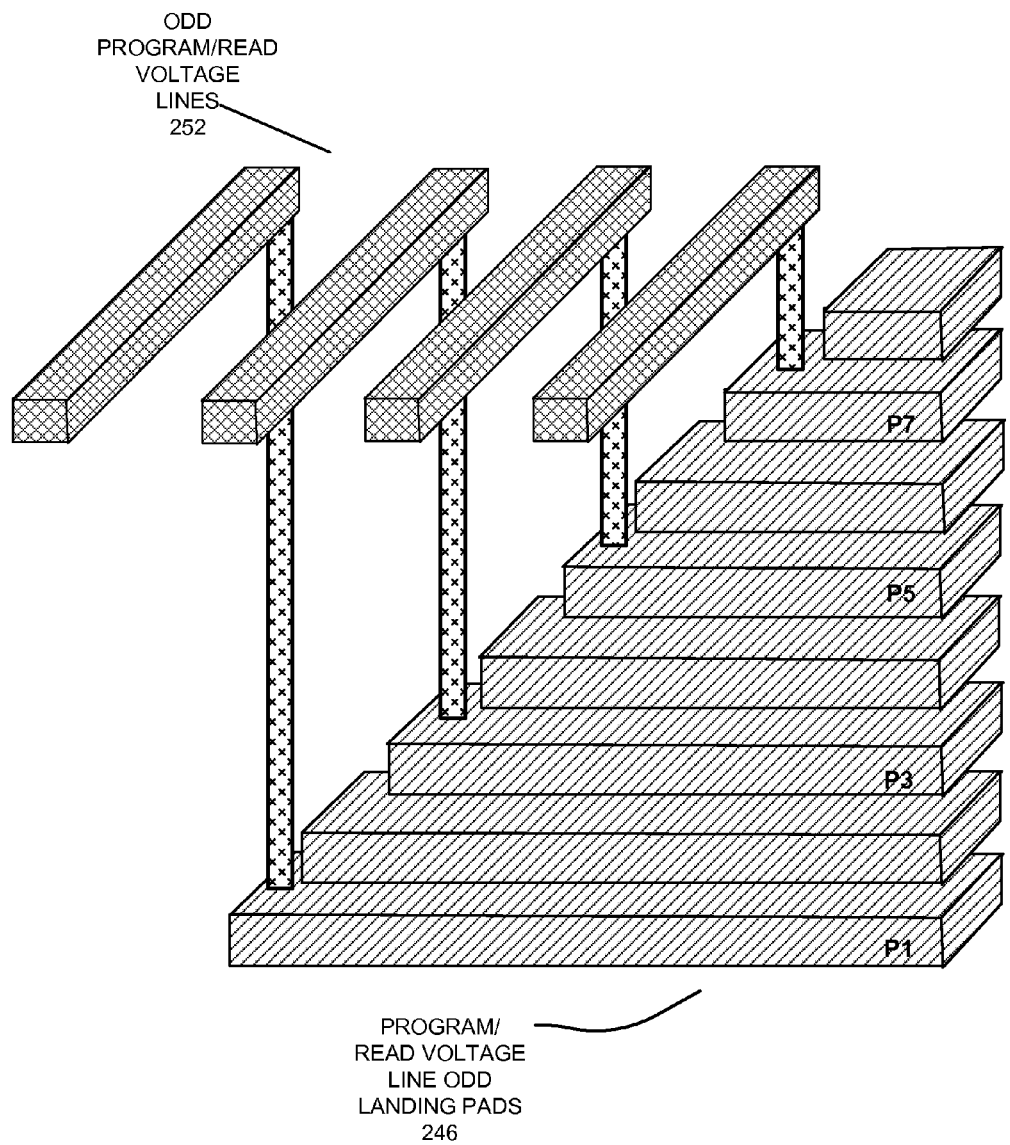
FIG. 17 is a perspective illustration of an example of the program and read voltage lines and program and read voltage line landing pads in the integrated circuit of FIG. 15, with odd access of bit lines rather than all bit line access as in FIG. 12.

FIG. 17 is a perspective illustration of an example of the program and read voltage lines and program and read voltage line landing pads in the integrated circuit of FIG. 15, with odd access of bit lines rather than all bit line access as in FIG. 12.

Odd program and read voltage lines 252 are conductive lines electrically coupled by a set of conductive plugs to respective ones of the odd program and read voltage line landing pads 246, including semiconductor strips P1, P3, P5, and P7.

Otherwise, the odd program and read voltage lines 252 can be similar to program and read voltage lines 242, and odd program and read voltage line landing pads 246 can be similar to program and read voltage line landing pads 236 of FIG. 12. Alternatively, the semiconductor strips other than P1, P3, P5, and P7 can be replaced with other material.

Figure 18:
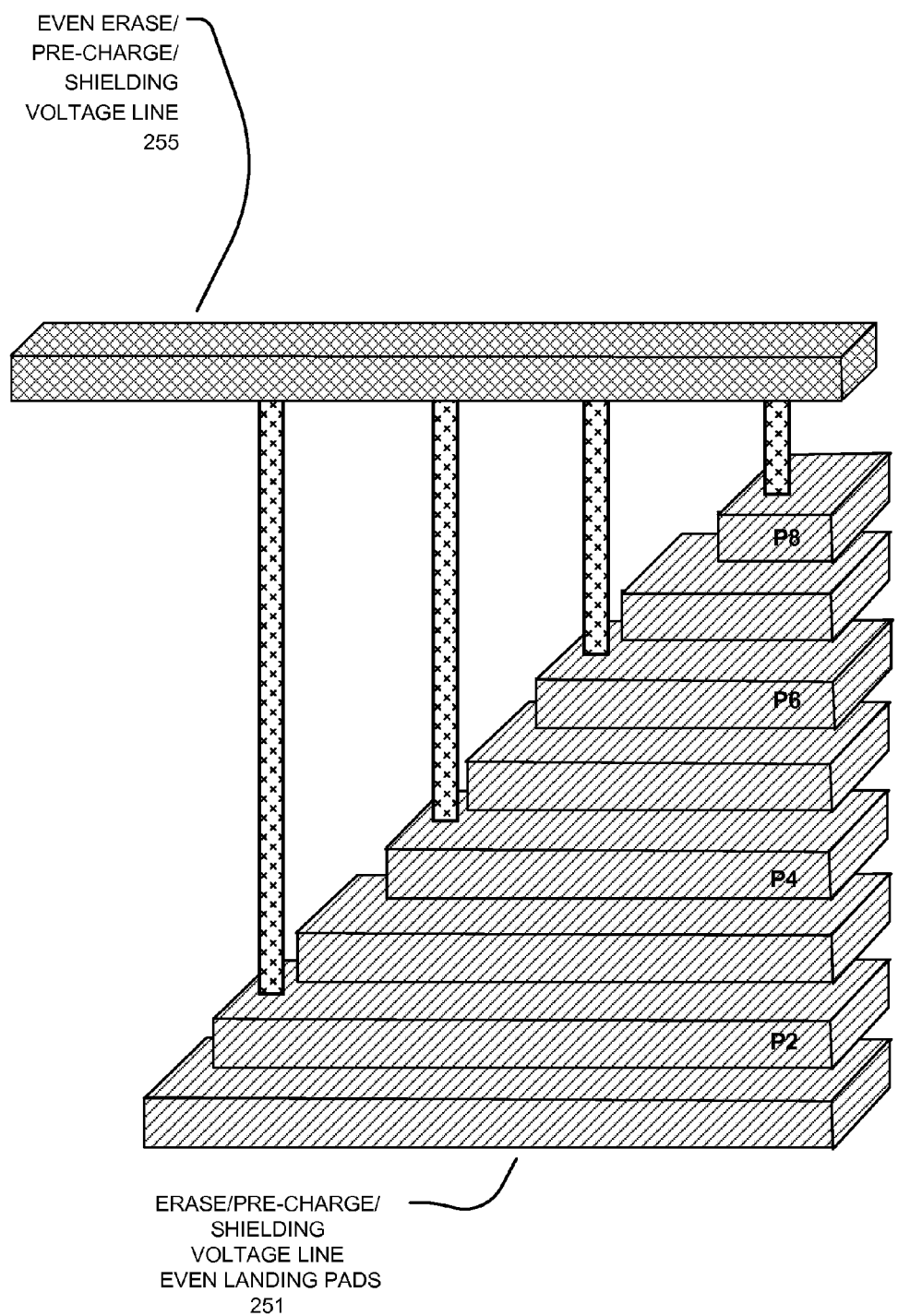
FIG. 18 is a perspective illustration of an example of the erase voltage line and erase voltage line landing pads in the integrated circuit of FIG. 15, with even access of bit lines rather than all bit line access as in FIG. 14.

FIG. 18 is a perspective illustration of an example of the erase/pre-charge/shielding voltage line and erase/pre-charge/shielding voltage line landing pads in the integrated circuit of FIG. 15, with even access of bit lines rather than all bit line access as in FIG. 14.

Even erase/pre-charge/shielding voltage line 255 is a conductive line electrically coupled by a set of conductive plugs to the even erase/pre-charge/shielding voltage line landing pads 251, including semiconductor strips P2, P4, P6, and P8.

Otherwise, the even erase/pre-charge/shielding voltage line 255 can be similar to erase/pre-charge/shielding voltage line 244, and even erase/pre-charge/shielding voltage line landing pads 251 can be similar to erase/pre-charge/shielding voltage line landing pads 240 of FIG. 14. Alternatively, the semiconductor strips other than P2, P4, P6, and P8 can be replaced with other material.

Figure 19:
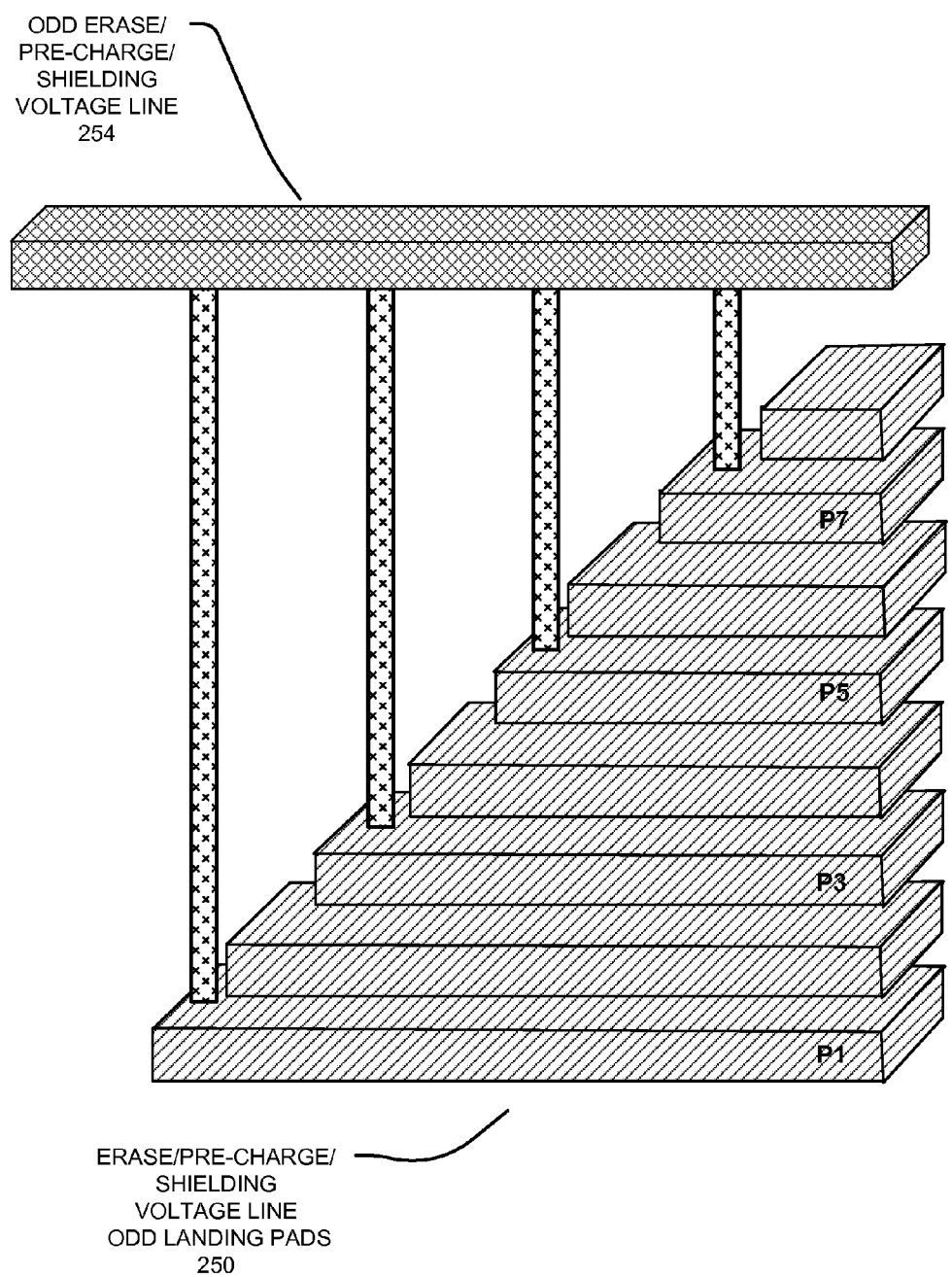
FIG. 19 is a perspective illustration of an example of the erase voltage line and erase voltage line landing pads in the integrated circuit of FIG. 15, with odd access of bit lines rather than all bit line access as in FIG. 14.

FIG. 19 is a perspective illustration of an example of the erase/pre-charge/shielding voltage line and erase/pre-charge/shielding voltage line landing pads in the integrated circuit of FIG. 15, with odd access of bit lines rather than all bit line access as in FIG. 14.

Odd erase/pre-charge/shielding voltage line 254 is a conductive line electrically coupled by a set of conductive plugs to the odd erase/pre-charge/shielding voltage line landing pads 250, including semiconductor strips P1, P3, P5, and P7.

Otherwise, the odd erase/pre-charge/shielding voltage line 254 can be similar to erase/pre-charge/shielding voltage line 244, and odd erase/pre-charge/shielding voltage line landing pads 250 can be similar to erase/pre-charge/shielding voltage line landing pads 240 of FIG. 14. Alternatively, the semiconductor strips other than P1, P3, P5, and P7 can be replaced with other material.

Figure 20:
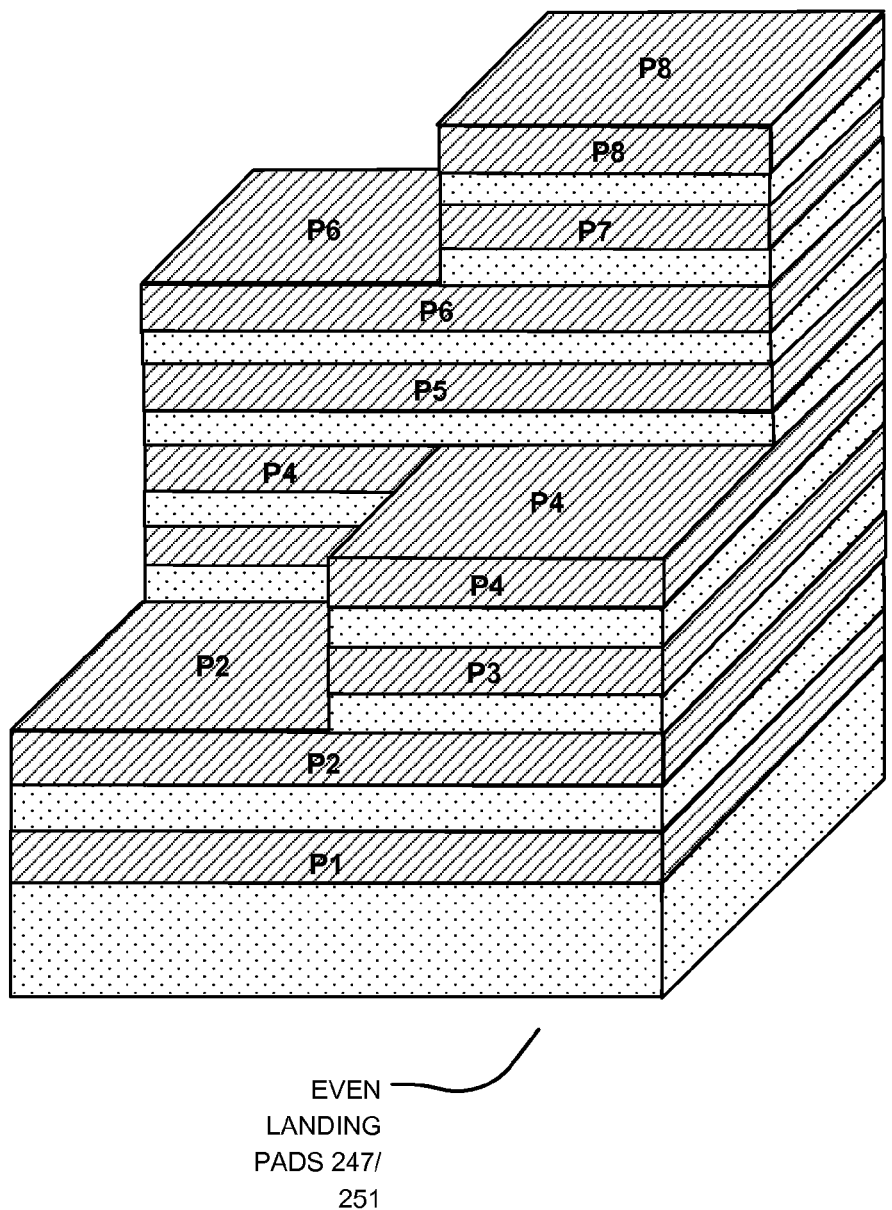
FIG. 20 is a perspective illustration of an example of the even landing pads in the integrated circuit of FIG. 15, as an alternative to the even landing pads of FIGS. 16 and 18.

FIG. 20 is a perspective illustration of an example of the even landing pads in the integrated circuit of FIG. 15, as an alternative to the even landing pads of FIGS. 16 and 18.

Instead of the even landing pads P2, P4, P6, and P8 being arranged in a line as in FIGS. 16 and 18, the even landing pads P2, P4, P6, and P8 are arranged in a checkerboard pattern. Otherwise, the even landing pads P2, P4, P6, and P8 can be similar to even landing pads 247 and 251 of FIGS. 16 and 18. Alternatively, the semiconductor strips other than P2, P4, P6, and P8 can be replaced with other material.

Figure 21:
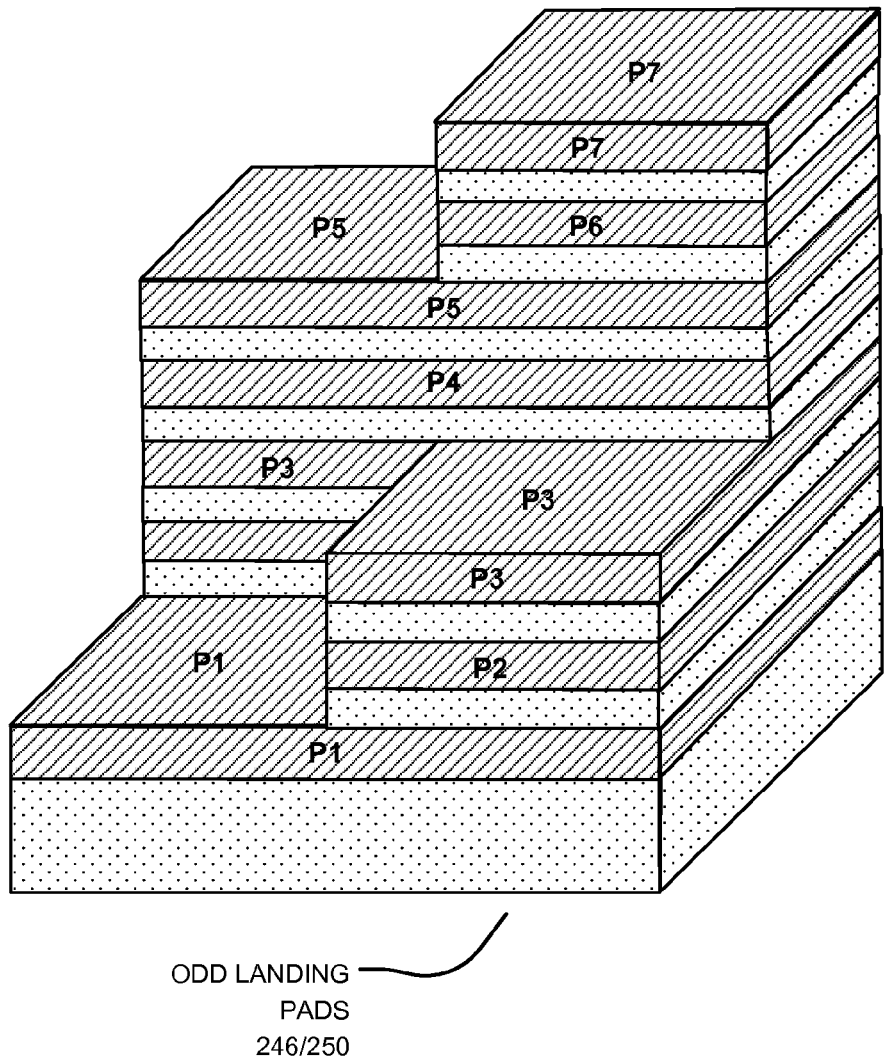
FIG. 21 is a perspective illustration of an example of the odd landing pads in the integrated circuit of FIG. 15, as an alternative to the odd landing pads of FIGS. 17 and 19.

FIG. 21 is a perspective illustration of an example of the odd landing pads in the integrated circuit of FIG. 15, as an alternative to the odd landing pads of FIGS. 17 and 19.

Instead of the odd landing pads P1, P3, P5, and P7 being arranged in a line as in FIGS. 17 and 19, the odd landing pads P1, P3, P5, and P7 are arranged in a checkerboard pattern. Otherwise, the odd landing pads P1, P3, P5, and P7 can be similar to odd landing pads 246 and 250 of FIGS. 17 and 19. Alternatively, the semiconductor strips other than P1, P3, P5, and P7 can be replaced with other material.

Figure 22:
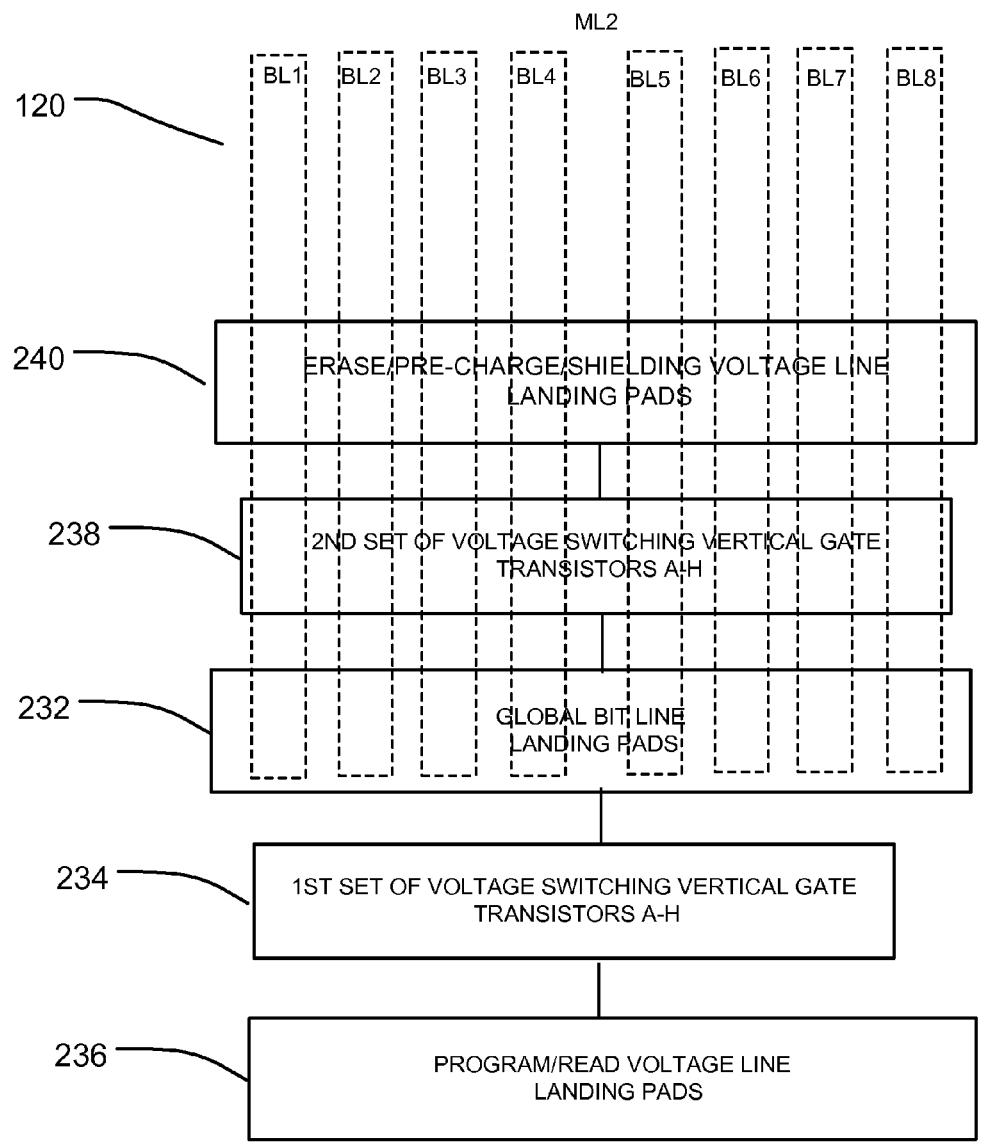
FIG. 22 is a block diagram showing an example of routing conductive lines at a routing layer in the integrated circuit of FIG. 8 with all bit line access.

FIG. 22 is a block diagram showing an example of routing conductive lines at a routing layer in the integrated circuit of FIG. 8 with all bit line access.

FIG. 22 shows parallel bit lines BL1-BL8 120 at metal layer ML2 coupled to global bit line landing pads 232.

Figure 23:
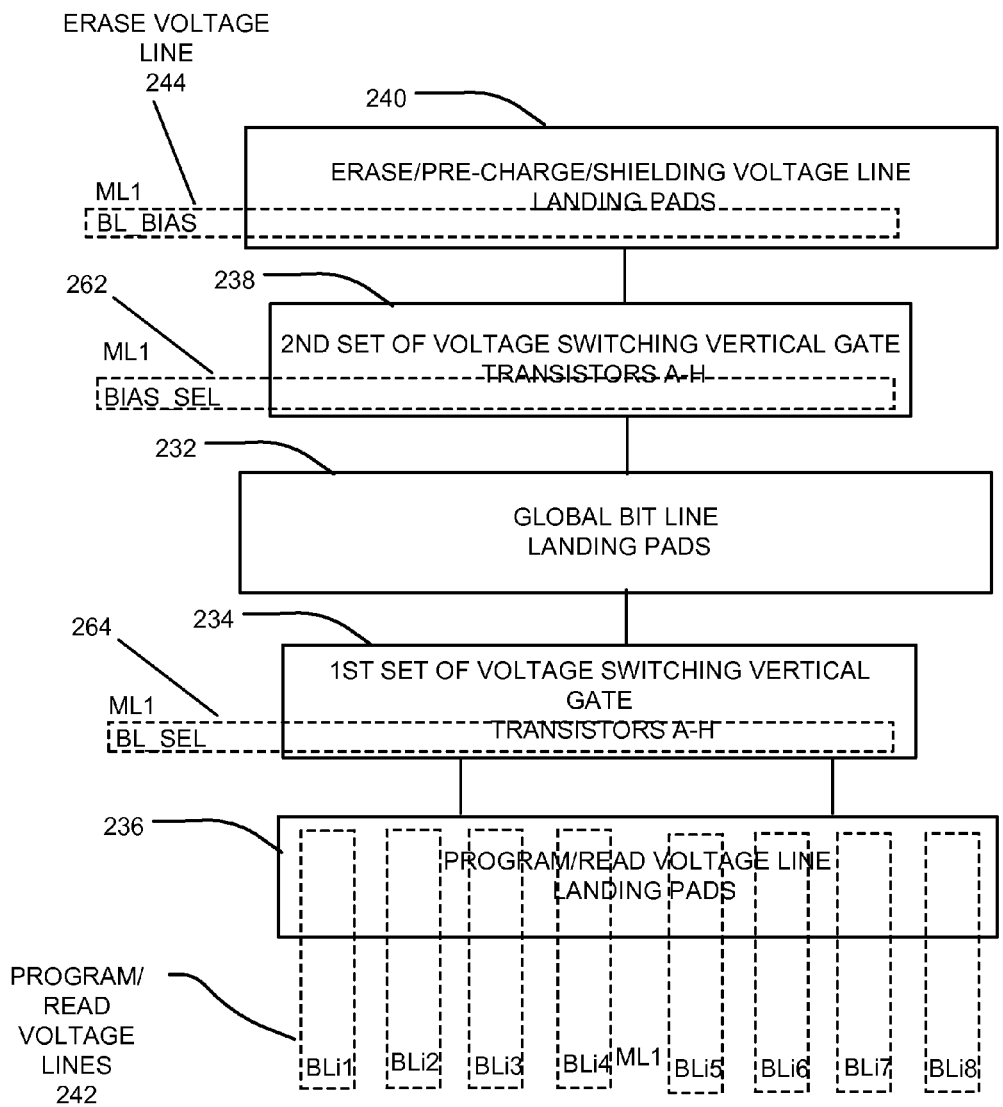
FIG. 23 is a block diagram showing an example of routing conductive lines at another routing layer in the integrated circuit of FIG. 8 with all bit line access.

FIG. 23 is a block diagram showing an example of routing conductive lines at another routing layer in the integrated circuit of FIG. 8 with all bit line access.

FIG. 23 shows parallel program and read voltage lines BLi1-BLi8 242 at metal layer ML1 coupled to program and read voltage line landing pads 236. The program and read voltage lines BLi1-BLi8 242 run in the same direction as bit lines BL1-BL8 120, although at different metal layers. BL_BIAS 244 is an erase/pre-charge/shielding voltage line coupled to erase/pre-charge/shielding voltage line landing pads 240. BIAS_SEL line 262 carries a gate voltage to control whether the 2nd set of vertical gate voltage switching transistors 238 is on or off. BL_SEL line 264 carries a gate voltage to control whether the 1st set of vertical gate voltage switching transistors 234 is on or off. BL_BIAS line 244, BIAS_SEL line 262, and BL_SEL line 264 are parallel and positioned at metal layer ML1. BL_BIAS line 244, BIAS_SEL line 262, and BL_SEL line 264 run in a direction orthogonal to BL1-BL8 120 and program and read voltage lines BLi1-BLi8 242.

In another embodiment, the metal layers ML1 and ML2 are changed. For example, one or both can be positioned at metal layers ML3 or higher. In another embodiment, the orientations of the metal lines can be rotated.

Figure 24:
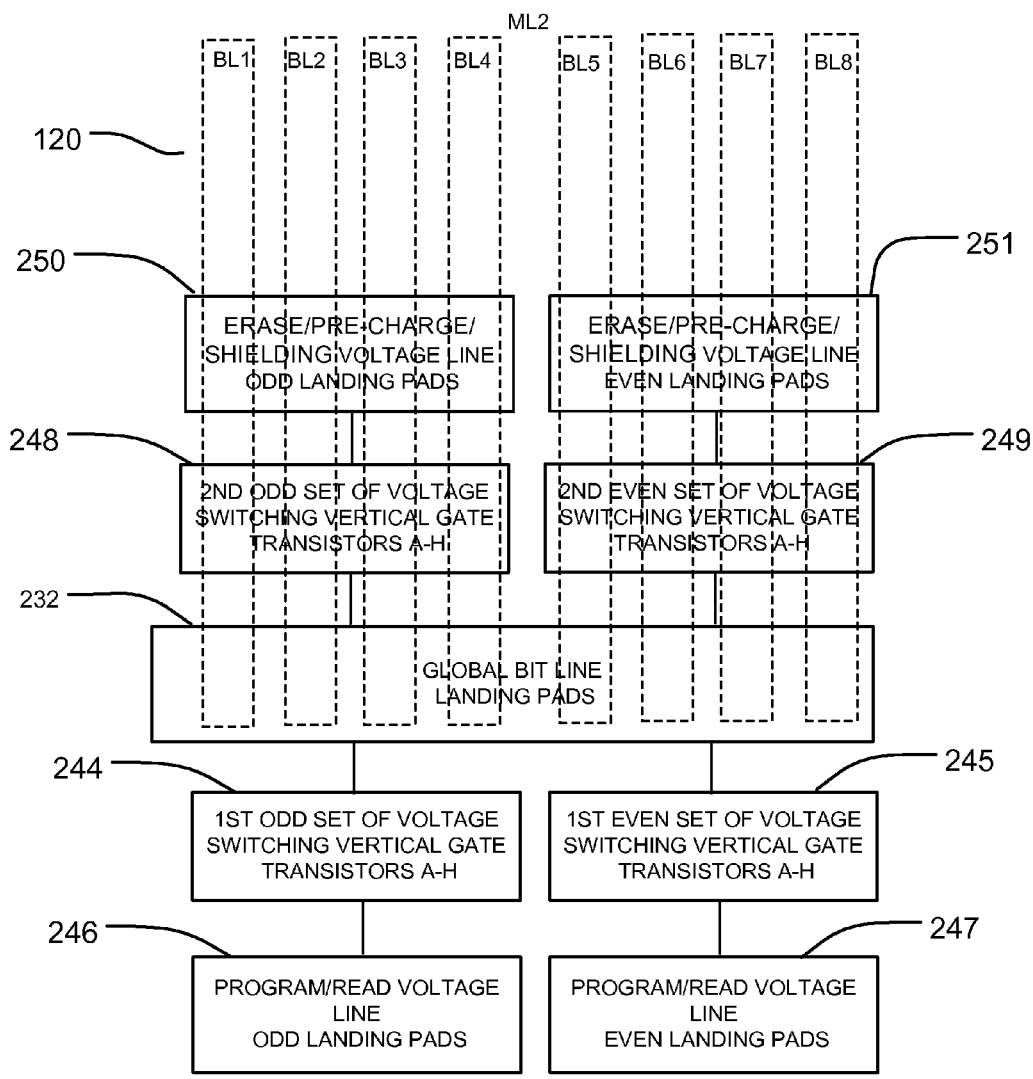
FIG. 24 is a block diagram showing an example of routing conductive lines at a routing layer in the integrated circuit of FIG. 15 with even and odd bit line access.

FIG. 24 is a block diagram showing an example of routing conductive lines at a routing layer in the integrated circuit of FIG. 15 with even and odd bit line access.

FIG. 24 shows parallel bit lines BL1-BL8 120 at metal layer ML2 coupled to global bit line landing pads 232.

Figure 25:
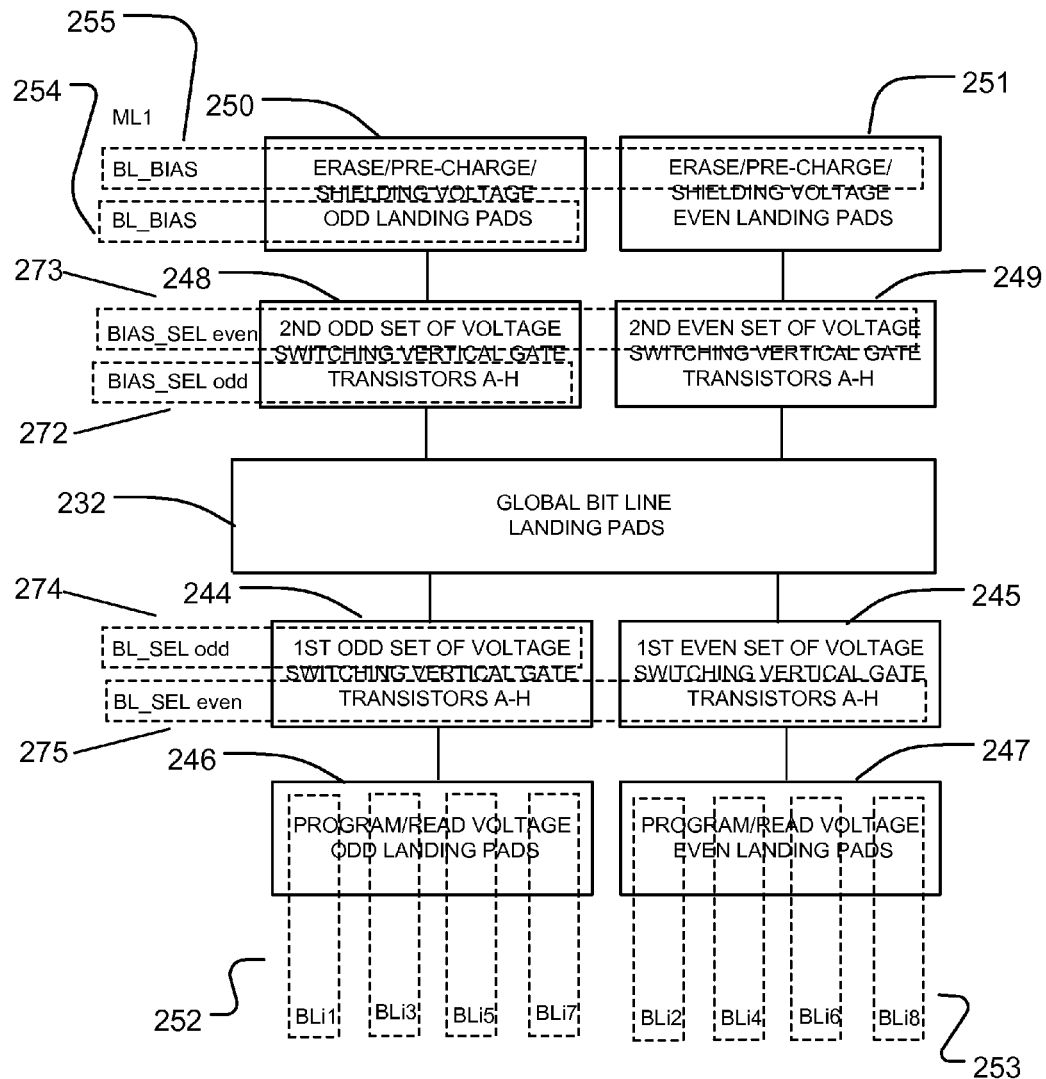
FIG. 25 is a block diagram showing an example of routing conductive lines at another routing layer in the integrated circuit of FIG. 15 with even and odd bit line access.

FIG. 25 is a block diagram showing an example of routing conductive lines at another routing layer in the integrated circuit of FIG. 15 with even and odd bit line access.

FIG. 25 shows parallel odd program and read voltage lines BLi1, BLi3, BLi5, and BLi7 252 at metal layer ML1 coupled to program and read voltage line odd landing pads 246, and parallel even program and read voltage lines BLi2, BLi4, BLi6, and BLi8 at metal layer ML1 coupled to program and read voltage line even landing pads 247. The program and read voltage lines are grouped into even and odd lines, unlike BLi1-BLi8 242 in FIG. 23. The odd program and read voltage lines BLi1, BLi3, BLi5, and BLi7 252 and even program and read voltage lines BLi2, BLi4, BLi6, and BLi8 run in the same direction as bit lines BL1-BL8 120, although at different metal layers.

BL_BIAS 254 is an odd erase/pre-charge/shielding voltage line coupled to erase/pre-charge/shielding voltage odd landing pads 250. BL_BIAS 255 is an even erase/pre-charge/shielding voltage line coupled to erase/pre-charge/shielding voltage even landing pads 251. The erase/pre-charge/shielding line is divided into even and odd lines, unlike BL_BIAS 244 in FIG. 23.

BIAS_SEL line 272 carries a gate voltage to control whether the 2nd odd set of vertical gate voltage switching transistors 248 is on or off. BIAS_SEL line 273 carries a gate voltage to control whether the 2nd even set of vertical gate voltage switching transistors 249 is on or off. The BIAS_SEL line is divided into even and odd lines, unlike BIAS_SEL line 262 in FIG. 23.

BL_SEL line 274 carries a gate voltage to control whether the 1st odd set of vertical gate voltage switching transistors 244 is on or off. BL_SEL line 275 carries a gate voltage to control whether the 1st even set of vertical gate voltage switching transistors 245 is on or off. The BL_SEL line is divided into even and odd lines, unlike the BL_SEL line 264 in FIG. 23.

BL_BIAS line 254, BL_BIAS line 255, BIAS_SEL line 272, BIAS_SEL line 273, BL_SEL line 274, and BL_SEL line 275 are parallel and positioned at metal layer ML1. BL_BIAS line 254, BL_BIAS line 255, BIAS_SEL line 272, BIAS_SEL line 273, BL_SEL line 274, and BL_SEL line 275 run in a direction orthogonal to BL1-BL8 120, odd program and read voltage lines BLi1, BLi3, BLi5, and BLi7 252 and even program and read voltage lines BLi2, BLi4, BLi6, and BLi8.

In another embodiment, the metal layers ML1 and ML2 are changed. For example, one or both can be positioned at metal layers ML3 or higher. In another embodiment, the orientations of the metal lines can be rotated.

Figure 26:
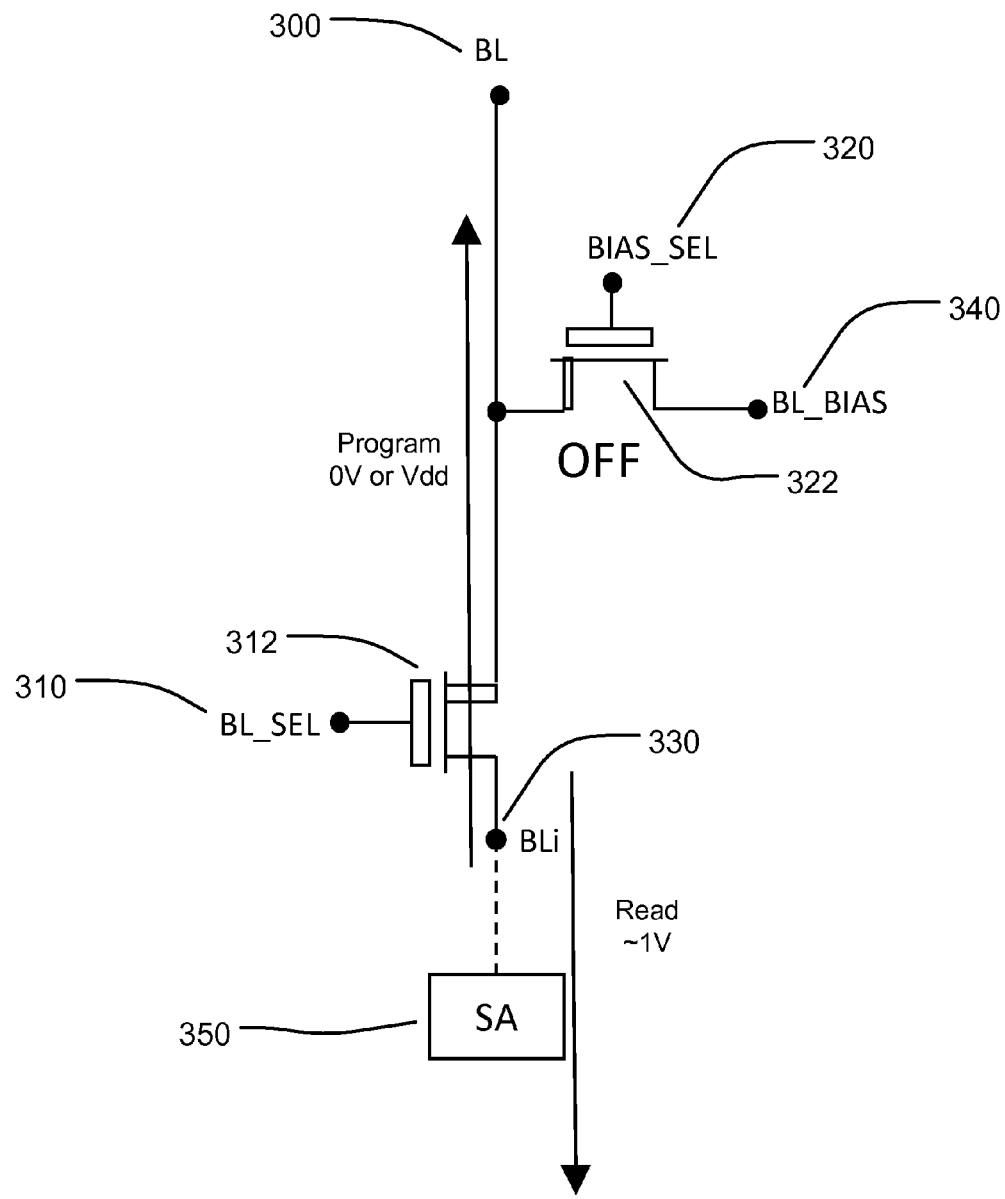
FIG. 26 is a simplified example circuit diagram of a pair of the vertical gate switching transistors with which a program or read operation is being performed.

FIG. 26 is a simplified example circuit diagram of a pair of the vertical gate switching transistors with which a program or read operation is being performed.

1st transistor 312 is turned on by gate voltage BL_SEL 310, electrically coupling BL 300 and BLi 330 which in turn is electrically coupled to sense amplifier SA 350. 2nd transistor 322 is turned off by gate voltage BIAS_SEL 320, electrically decoupling BL 300 from BL_BIAS 340. For a program operation, a program voltage of 0V or Vdd is passed by 1st transistor 312 to BL 300. For a read operation, a read voltage of ~1V is passed by 1st transistor 312 to SA 350.

Figure 27:
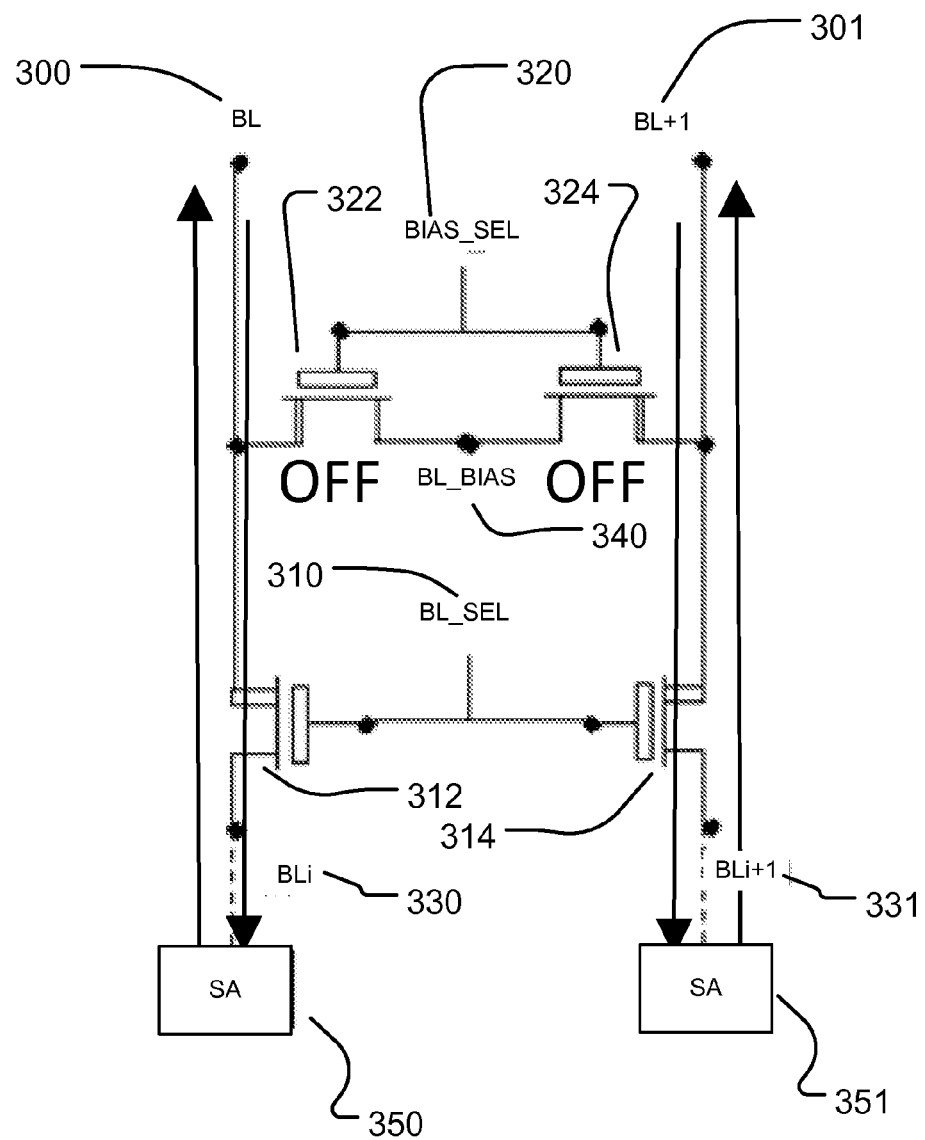
FIG. 27 is a simplified example circuit diagram of pairs of the vertical gate switching transistors with which a program or read operation is being performed, such as in the integrated circuit of FIG. 8 with all bit line access.

FIG. 27 is a simplified example circuit diagram of pairs of the vertical gate switching transistors with which a program or read operation is being performed, such as in the integrated circuit of FIG. 8 with all bit line access.

The circuit of FIG. 27 is similar to FIG. 26, except that the quantities of switching transistors and sense amplifiers are increased along with the quantity of bit lines. To control bit line BL+1 301, 1st transistor 314, 2nd transistor 324, BLi 331, and sense amplifier SA 351 are added. Bit line BL+1 301, 1st transistor 314, 2nd transistor 324, BLi 331, and sense amplifier SA 351 perform like respective bit line BL 300, 1st transistor 312, 2nd transistor 322, BLi 330, and sense amplifier SA 350.

Figure 28:
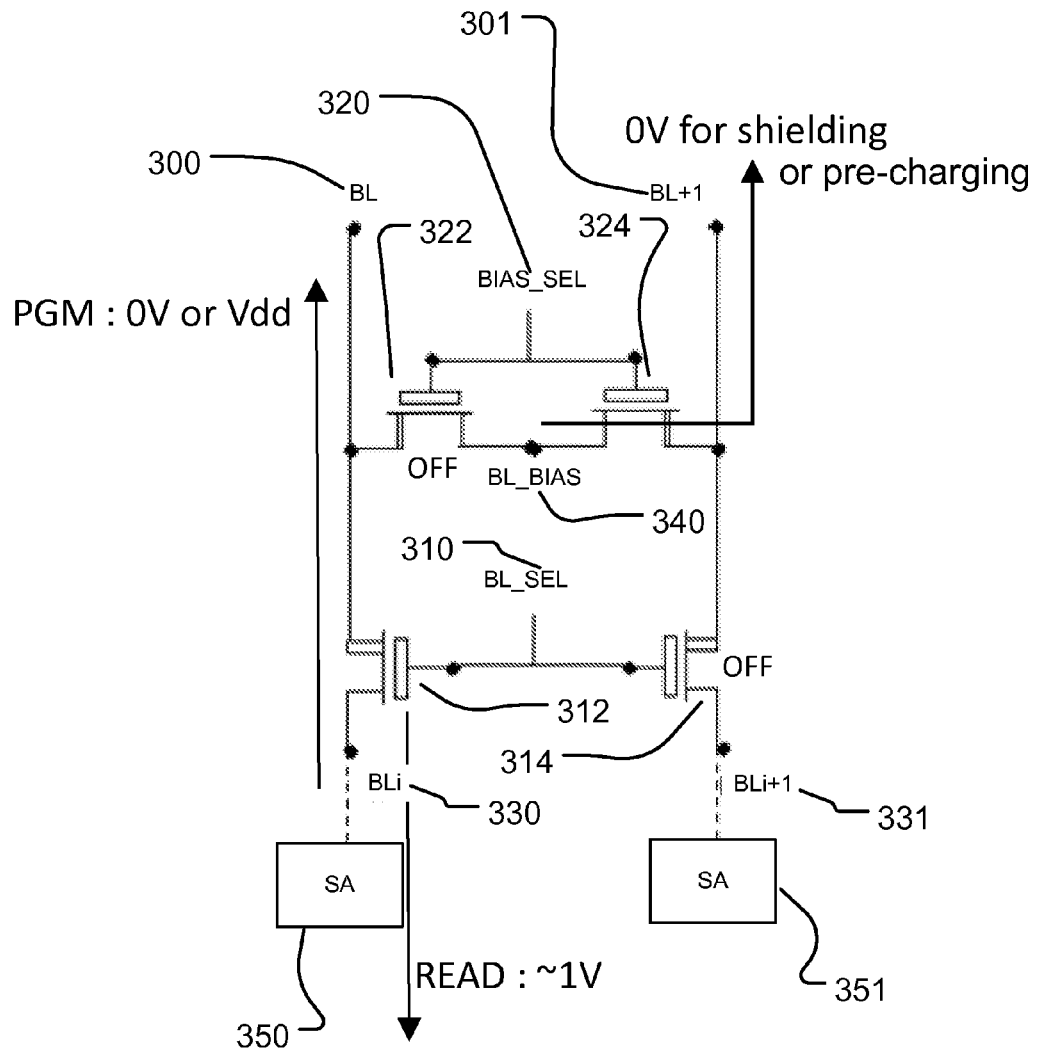
FIG. 28 is a simplified example circuit diagram of pairs of the vertical gate switching transistors with which a program or read operation is being performed, such as in the integrated circuit of FIG. 15 with even and odd bit line access.

FIG. 28 is a simplified example circuit diagram of pairs of the vertical gate switching transistors with which a program or read operation is being performed, such as in the integrated circuit of FIG. 15 with even and odd bit line access.

The circuit of FIG. 28 is similar to FIG. 27, except that every other bit line is accessed, such that either even bit lines or odd bit lines are accessed. In the example, for a program operation a program voltage of 0V or Vdd is passed by 1st transistor 312 to BL 300, or for a read operation a read voltage of ~1V is passed by 1st transistor 312 to SA 350. Simultaneously, whether a program operation or a read operation is being performed with BL 300, no operation is being performed with BL+1 301. 1st transistor 324 is turned on and 2nd transistor 314 is turned off, electrically coupling BL+1 301 to 0V for shielding or pre-charging BL+1 from the ongoing program operation or read operation in adjacent BL 300.

Figure 29:
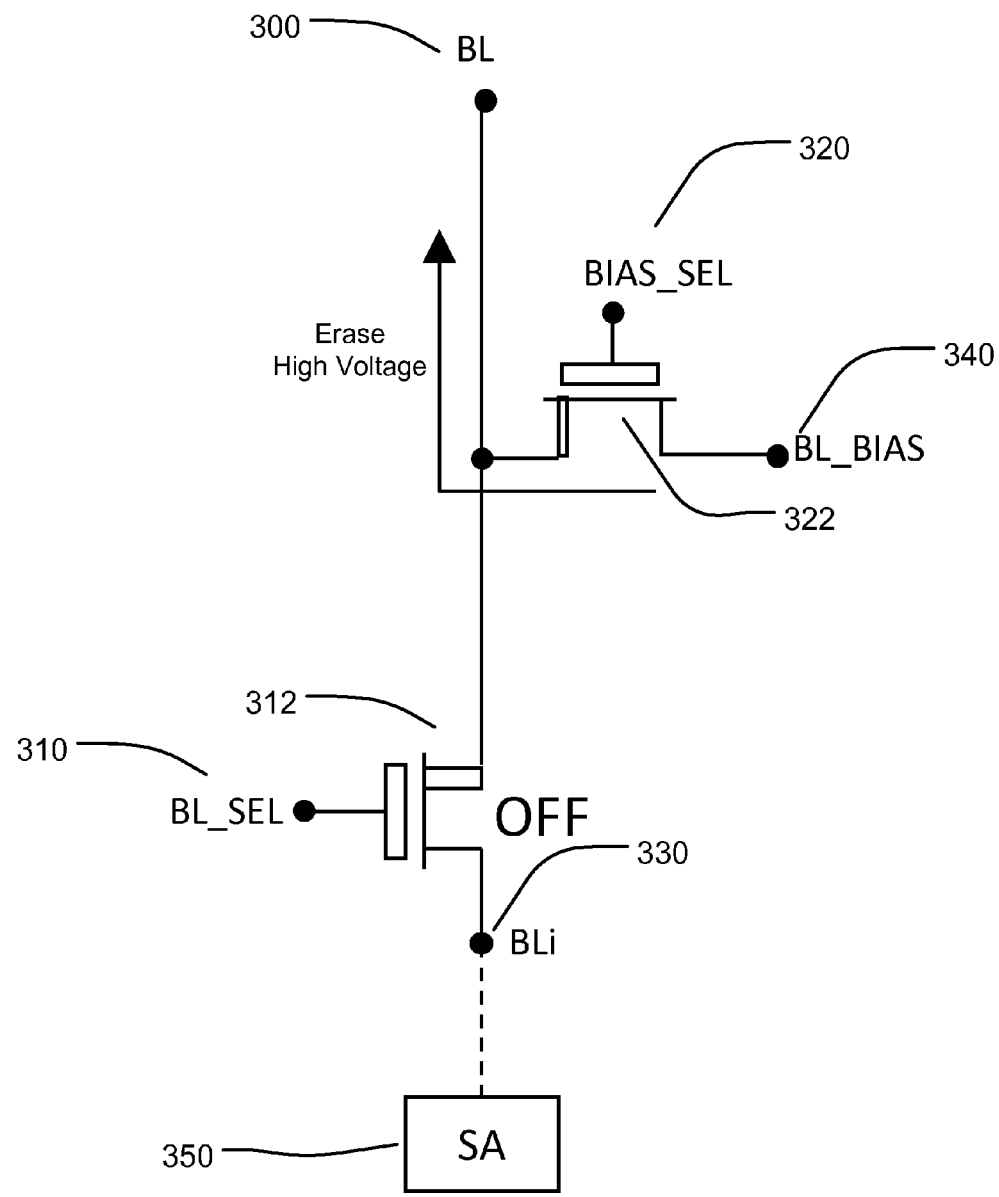
FIG. 29 is a simplified example circuit diagram of a pair of the vertical gate switching transistors with which an erase operation is being performed.

FIG. 29 is a simplified example circuit diagram of a pair of the vertical gate switching transistors with which an erase operation is being performed.

1st transistor 312 is turned off by gate voltage BL_SEL 310, electrically decoupling BL 300 from BLi 330. 2nd transistor 322 is turned on by gate voltage BIAS_SEL 320, electrically coupling BL 300 to BL_BIAS 340. For an erase operation, a high magnitude erase voltage is passed by 2nd transistor 322 to BL 300.

Figure 30:
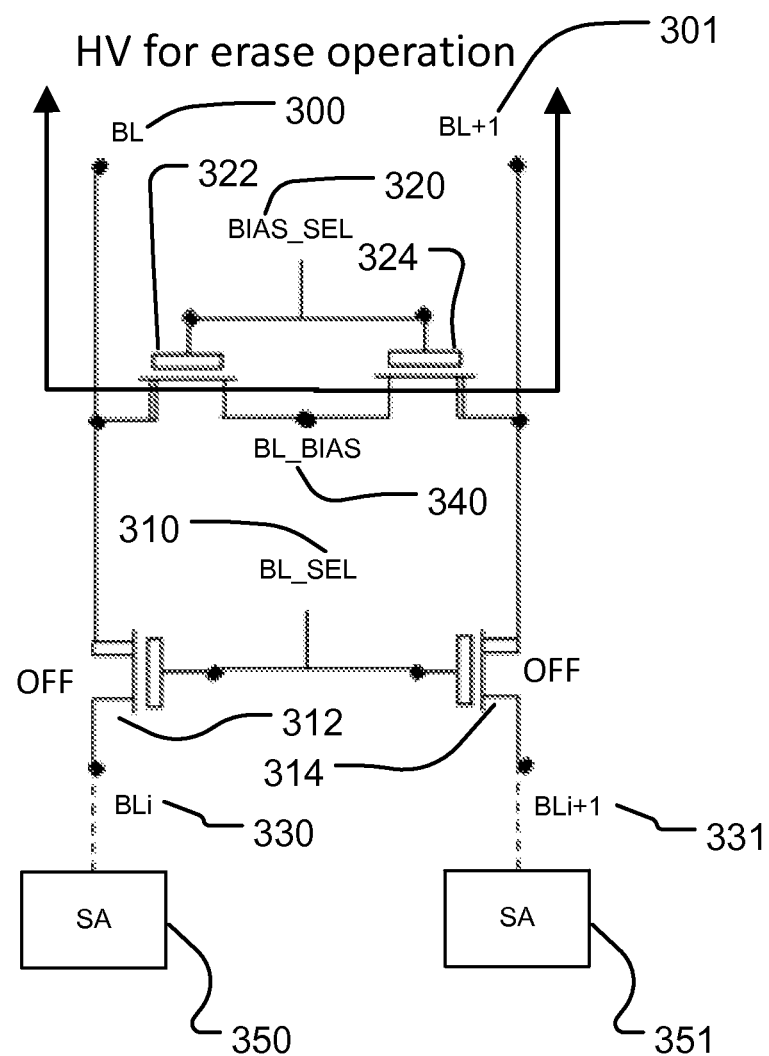
FIG. 30 is a simplified example circuit diagram of pairs of the vertical gate switching transistors with which an erase operation is being performed, such as in the integrated circuit of FIG. 8 with all bit line access.

FIG. 30 is a simplified example circuit diagram of pairs of the vertical gate switching transistors with which an erase operation is being performed, such as in the integrated circuit of FIG. 8 with all bit line access.

The circuit of FIG. 30 is similar to FIG. 29, except that the quantities of switching transistors and sense amplifiers are increased along with the quantity of bit lines. To control bit line BL+1 301, 1st transistor 314, 2nd transistor 324, BLi 331, and sense amplifier SA 351 are added. Bit line BL+1 301, 1st transistor 314, 2nd transistor 324, BLi 331, and sense amplifier SA 351 perform like respective bit line BL 300, 1st transistor 312, 2nd transistor 322, BLi 330, and sense amplifier SA 350.

Figure 31:
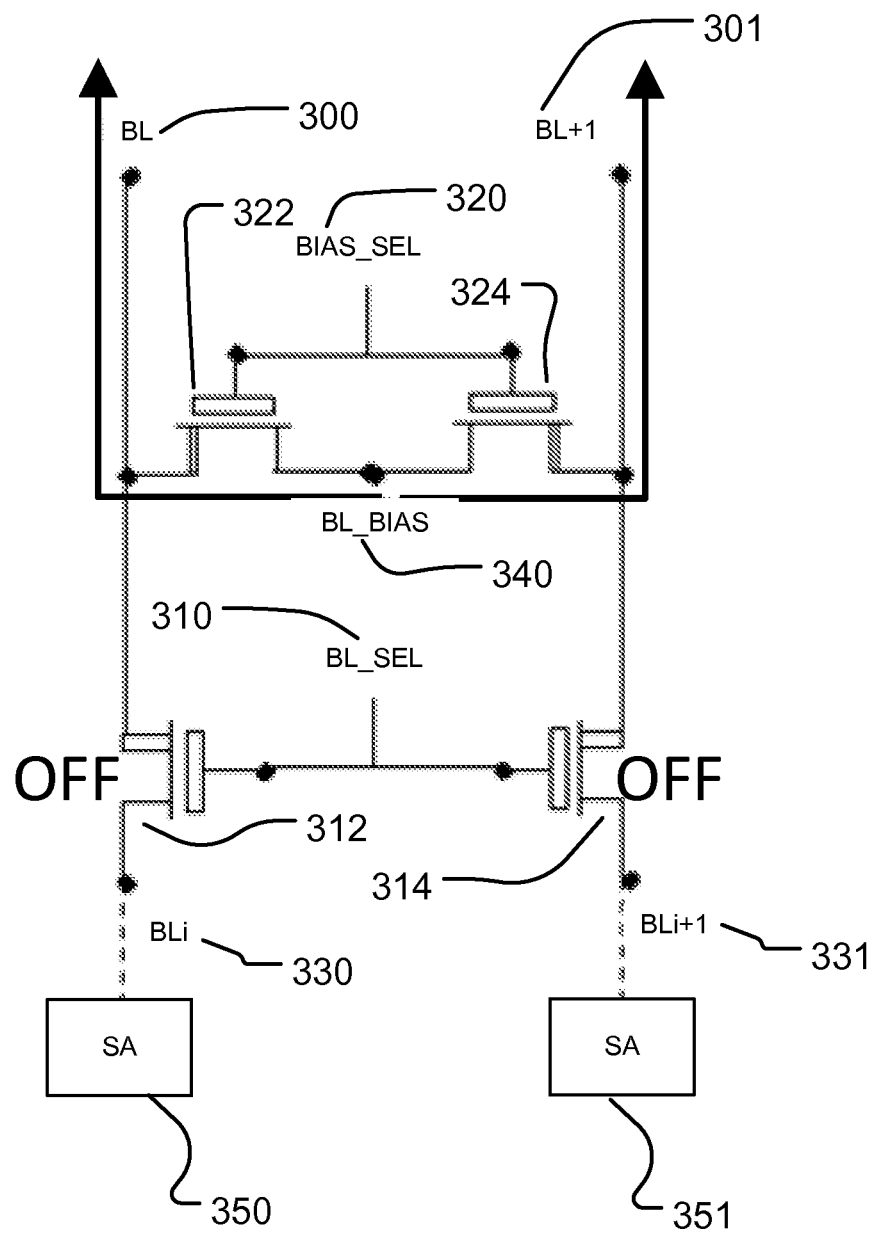
FIG. 31 is a simplified example circuit diagram of pairs of the vertical gate switching transistors with which an erase operation is being performed, such as in the integrated circuit of FIG. 15 with even and odd bit line access.

FIG. 31 is a simplified example circuit diagram of pairs of the vertical gate switching transistors with which an erase operation is being performed, such as in the integrated circuit of FIG. 15 with even and odd bit line access.

The circuit of FIG. 31 is similar to FIG. 28, except that an erase operation is being performed in the integrated circuit of with even and odd bit line access, rather than a program or read operation. Unlike with the program or read operation of FIG. 28, in the erase operation of 31, even bit lines and odd bit lines are biased similarly. So both BL 300 and BL+1 301 are biased with high magnitude erase voltage.

Figure 32:
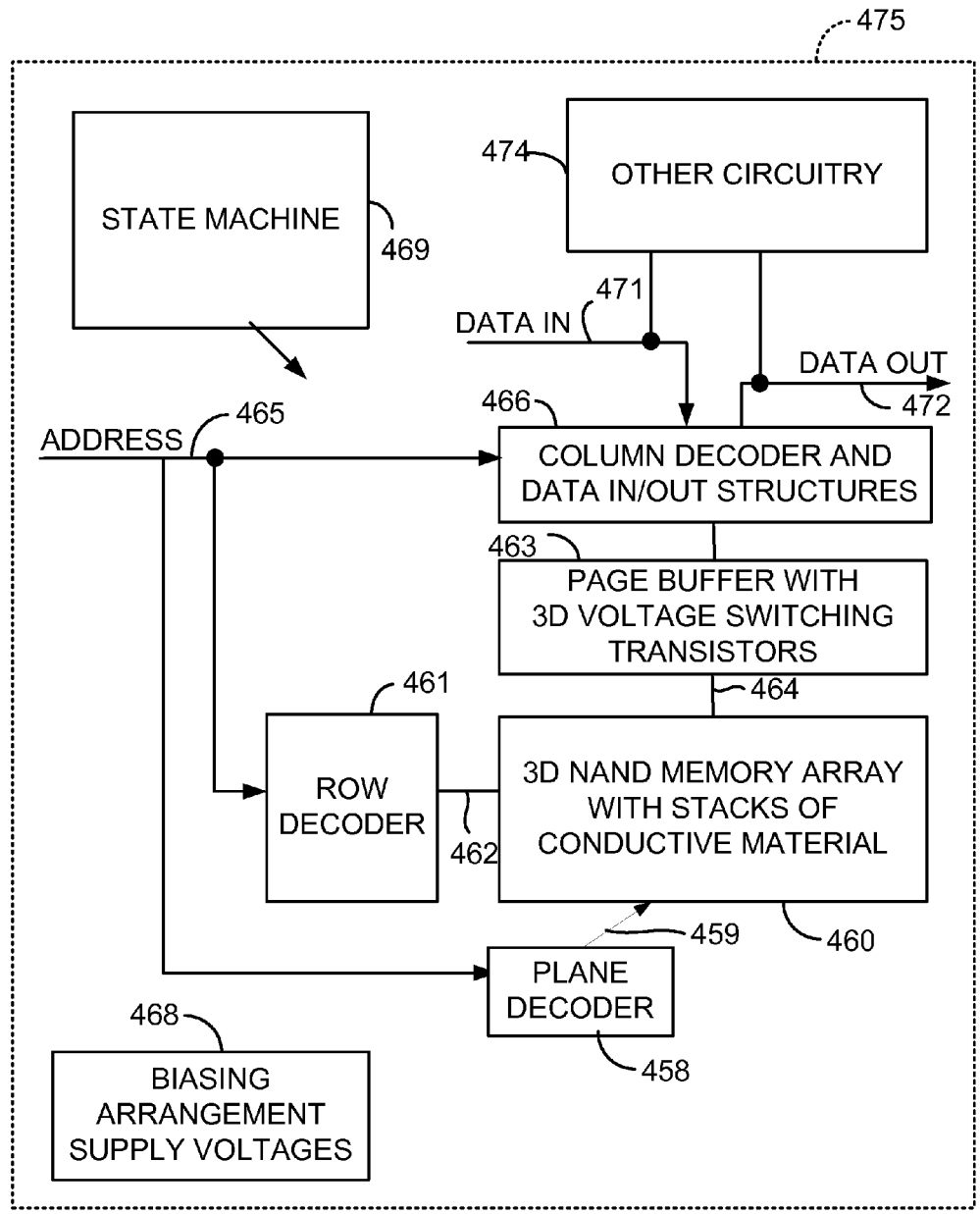
FIG. 32 is a simplified block diagram of an integrated circuit with vertical gate voltage switching transistors.

FIG. 32 is a simplified block diagram of an integrated circuit with vertical gate voltage switching transistors.

The integrated circuit line 475 includes a 3D NAND flash memory array 460, implemented as described herein, on a semiconductor substrate with stacks of conductive material and with capacitors with stacks of conductive material. A row decoder 461 is coupled to a plurality of word lines 462, and arranged along rows in the memory array 460. A column decoder in block 466 is coupled to a plurality of SSL lines 464 arranged along columns corresponding to stacks in the memory array 460 for reading and programming data from the memory cells in the array 460. A plane decoder 458 is coupled to a plurality of planes in the memory array 460 via bit lines 459. Addresses are supplied on bus 465 to column decoder 466, row decoder 461 and plane decoder 458. Page buffer 463 is coupled to the column decoder in block 466 and the array 460. The page buffer 463 includes 3D high voltage switching transistors as shown in various embodiments. The page buffer 463 multiplexes the BL lines leading to the array with the BLi lines leading to the sense amplifiers or the BL_BIAS voltages for erase biases. Such multiplexing may be split into even and odd lines. The page buffer 463 can include the sense amplifiers to perform read and verify operations. The page buffer 463 can include additional circuitry such as fail detection circuitry that determines whether a verify operation is followed by pass/retry/fail, data caches for read/program data for sensing and program operations, and cache decoding/output buffer. Data is supplied via the data-in line 471 from input/output ports on the integrated circuit 475 or from other data sources internal or external to the integrated circuit 475, to the data-in structures in block 466. In the illustrated embodiment, other circuitry 474 is included on the integrated circuit, such as a general purpose processor or special purpose application circuitry, or a combination of modules providing system-on-a-chip functionality supported by the NAND flash memory cell array. Data is supplied via the data-out line 472 from the data out structures in block 466 to input/output ports on the integrated circuit 475, or to other data destinations internal or external to the integrated circuit 475.

A controller implemented in this example using bias arrangement state machine 469 controls the application of bias arrangement supply voltage generated or provided through the voltage supply or supplies in block 468, such as read, erase, program, erase verify and program verify voltages, and gate voltages to control the 1st and 2nd sets of vertical gate voltage switching transistors. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

In some embodiments, the routing can decoding are changed to alter the respective positions of the plane decoder, row decoder, and/or column decoder.

The above descriptions may have used terms such as above, below, top, bottom, over, under, et cetera. These terms may be used in the description and claims to aid understanding of the invention and not used in a limiting sense.

Figure 33:
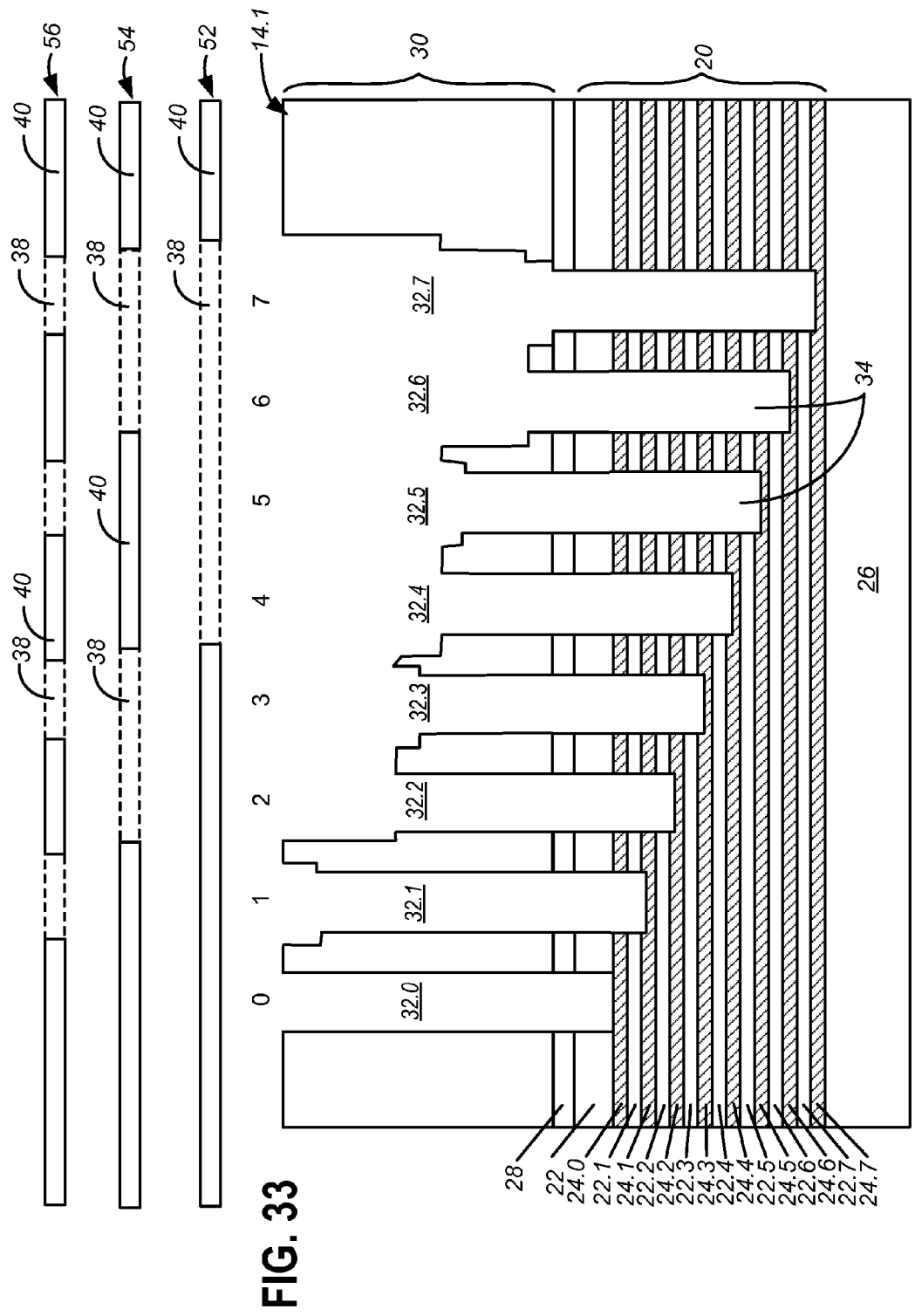
FIG. 33 is an example cross-sectional view showing how different mask combinations can generate landing areas of different depths.

FIG. 33 is an example cross-sectional view showing how different mask combinations can generate landing areas of different depths. For the landing pad structures disclosed herein.

A stack 20 of alternating dielectric layers 22 and electrically conductive layers 24 are formed over dielectric substrate 26. In this example, there are eight pairs of dielectric layers 22 and electrically conductive layers 24 identified as dielectric layers 22.0 through 22.7 and electrically conductive layers 24.0 through 24.7. Hard mask 30, etch stop layer 28 and a first dielectric layer 22 cover the stack 20.

Contact openings 32.0-32.7 are etched to varying depths depending on the combination of closed mask regions 40 and open etch regions 38 across the multiple etches performed with the first photoresist mask 52, second photoresist mask 54, and third photoresist mask 56.

First photoresist mask 52 has one open etch region 38 covering half (4 in this example) of the contact openings 32 and the hard mask 30.1 therebetween. First photoresist mask 52 also has one closed mask region 40 covering the other contact openings and the hard mask 30.1 therebetween. Second photoresist mask 54 has two open etch regions 38 and two closed mask regions 40 each alternatingly covering one fourth (2 in this example) of the contact openings 32 and the hard mask 30.1 therebetween. Third photoresist mask 56 has four open etch regions 38 and four closed mask regions 40, each alternatingly covering one eighth (1 in this example) of the contact openings 32.

Reactive ion etching can use an etch chemistry, for example, including CF4/N2/CH2F2/HBR/He-O2/He, stopping on top of the appropriate electrically conductive layer 24.0-24.7.

In the shown embodiment, the landing pads are arranged in a line, corresponding with the closed mask regions 40 and open etch regions 38 arranged in a line in the masks. In another embodiment, the closed mask regions 40 and open etch regions 38 are arranged in an adjacent checkerboard pattern, to generate the even or odd landing pads arranged in an adjacent checkerboard pattern.

Further information on similar techniques and methods for connecting electrical conductors 46 to landing pads 60 are disclosed in U.S. patent application Ser. No. 13/049,303, filed 16 Mar. 2011, entitled REDUCED NUMBER OF MASK FOR IC DEVICE WITH STACKED CONTACT LEVELS; and in U.S. patent application Ser. No. 13/114,931, filed 24 May 2011, entitled MULTILAYER CONNECTION STRUCTURE AND MAKING METHOD, the disclosures of which are incorporated by reference. These two applications and the present application have a common assignee.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. Any and all patents, patent applications and printed publications referred to above are incorporated by reference.

The invention claimed is:

1. An integrated circuit comprising:
a 3D NAND array of memory transistors;
a plurality of bit lines electrically coupled to the 3D NAND array;
a plurality of transistor pairs with a stack of semiconductor layers, different layers in the stack of semiconductor layers including source/drain terminals of different transistor pairs of the plurality of transistor pairs, each of the plurality of transistor pairs including first and second transistors with first, second, and third source/drain terminals, wherein:
the first transistor includes the first and the third source/drain terminals, and the second transistor includes the second and the third source/drain terminals
the first source/drain terminal is electrically coupled to an erase voltage line, the second source/drain terminal is electrically coupled to a corresponding one of a plurality of program/read voltage lines, and the third source/drain terminal is electrically coupled to a corresponding one of the plurality of bit lines;
a first gate controls all of the first transistors of the plurality of transistor pairs; and a second gate controls all of the second transistors of the plurality of transistor pairs.

2. The integrated circuit of claim 1, wherein the first gate controls whether the plurality of bit lines is electrically coupled to the first source/drain terminals of the plurality of transistor pairs, and
wherein the second gate controls whether the plurality of bit lines is electrically coupled to the second source/drain terminals of the plurality of transistor pairs.

3. The integrated circuit of claim 1,
wherein the 3D NAND array includes a plurality of stacks of semiconductor strips positioned as transistor channels of different ones of the memory transistors in the 3D NAND array, and
the stack of semiconductor layers includes:
a first stack of semiconductor strips positioned as transistor channels of different ones of the first transistors of the plurality of transistor pairs, and
a second stack of semiconductor strips positioned as transistor channels of different ones of the second transistors of the plurality of transistor pairs.

4. The integrated circuit of claim 3, wherein a plurality of plane positions are shared by the semiconductor strips in the first stack of semiconductor strips, the semiconductor strips in the second stack of semiconductor strips, and the semiconductor strips in the plurality of stacks of semiconductor strips.

5. The integrated circuit of claim 1, further comprising:
circuitry generating a first set of voltages for the erase voltage line and a second set of voltages for the plurality of program/read voltage lines.

6. The integrated circuit of claim 3, wherein the semiconductor strips of the first stack of semiconductor strips are electrically coupled to adjacent bit lines in the plurality of bit lines.

7. The integrated circuit of claim 3, wherein the semiconductor strips of the first stack of semiconductor strips are electrically coupled to nonadjacent bit lines in the plurality of bit lines.

8. The integrated circuit of claim 1, further comprising:
circuitry performing:
(i) turning on the first plurality of transistors and turning off the second plurality of transistors; and
(ii) turning on the second plurality of transistors and turning off the first plurality of transistors.

9. A method of operating a plurality of bit lines electrically coupled to a 3D NAND array of memory transistors, comprising:
switchably electrically coupling the plurality of bit lines to one of:
(i) a first set of voltages via a first plurality of transistors for at least a first memory operation type of the 3D NAND array, the first plurality of transistors with a first stack of semiconductor strips; and
(ii) a second set of voltages via a second plurality of transistors for at least a second memory operation type of the 3D NAND array, the second plurality of transistors with a second stack of semiconductor strips, the first memory operation type being different from the second memory operation type,
wherein the semiconductor strips in the first stack of semiconductor strips are positioned as transistor channels of different ones of the first plurality of transistors, the semiconductor strips in the second stack of semiconductor strips are positioned as transistor channels of different ones of the second plurality of transistors, and the 3D NAND array includes a plurality of stacks of semiconductor strips positioned as transistor channels of different ones of the memory transistors in the 3D NAND array, and
wherein a plurality of plane positions are shared by the semiconductor strips in the first stack of semiconductor strips, the semiconductor strips in the second stack of semiconductor strips, and the semiconductor strips in the plurality of stacks of semiconductor strips, wherein different ones of the plurality of plane positions correspond to different transistor channels.

10. The method of claim 9, wherein the first memory operation type includes erase, and the second memory operation type includes at least one of read and program.

11. The method of claim 9, wherein the first memory operation type includes erase, pre-charge, and shielding, and the second memory operation type includes read and program.

12. The method of claim 9, wherein different bit lines in the plurality of bit lines are electrically coupled to different planes of the 3D NAND array.

13. The method of claim 9, further comprising:
generating the first set of voltages for the first memory operation type and the second set of voltages for the second memory operation type.

14. The method of claim 9, wherein the semiconductor strips of the first stack of semiconductor strips are electrically coupled to adjacent bit lines in the plurality of bit lines.

15. The method of claim 9, wherein the semiconductor strips of the first stack of semiconductor strips are electrically coupled to nonadjacent bit lines in the plurality of bit lines.

16. The method of claim 9, further comprising:
turning on the first plurality of transistors and turning off the second plurality of transistors to couple the first set of voltages to the plurality of bit lines for at least the first memory operation type; and
turning on the second plurality of transistors and turning off the first plurality of transistors to couple the second set of voltages to the plurality of bit lines for at least the second memory operation type.

17. A method of manufacturing an integrated circuit comprising:
providing a 3D NAND array of memory transistors;
providing a plurality of bit lines electrically coupled to 3D NAND array;
providing a plurality of transistor pairs with a stack of semiconductor layers, different layers in the stack of semiconductor layers including source/drain terminals of different transistor pairs of the plurality of transistor pairs, each of the plurality of transistor pairs including first and second transistors with first, second, and third source/drain terminals, wherein:
the first transistor includes the first and the third source/drain terminals, and the second transistor includes the second and the third source/drain terminals;
the first source/drain terminal is electrically coupled to an erase voltage line, the second source/drain terminal is electrically coupled to a corresponding one of a plurality of program/read voltage lines, and the third source/drain terminal is electrically coupled to a corresponding one of the plurality of bit lines;
a first gate controls all of the first transistors of the plurality of transistor pairs; and
a second gate controls all of the second transistors of the plurality of transistor pairs.

* * * * *